US009864136B1

(12) United States Patent
Jacob

(10) Patent No.: US 9,864,136 B1
(45) Date of Patent: Jan. 9, 2018

(54) NON-PLANAR MONOLITHIC HYBRID OPTOELECTRONIC STRUCTURES AND METHODS

(71) Applicant: GLOBALFOUNDRIES INC., GRAND CAYMAN (KY)

(72) Inventor: Ajey P. Jacob, Watervliet, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/231,840

(22) Filed: Aug. 9, 2016

(51) Int. Cl.
  G02B 6/12 (2006.01)
  H01L 31/028 (2006.01)
  H01L 31/0304 (2006.01)
  H01L 31/12 (2006.01)
  G02B 6/13 (2006.01)

(52) U.S. Cl.
  CPC ......... G02B 6/12004 (2013.01); G02B 6/131 (2013.01); H01L 31/028 (2013.01); H01L 31/0304 (2013.01); H01L 31/125 (2013.01); G02B 2006/121 (2013.01); G02B 2006/12097 (2013.01); G02B 2006/12123 (2013.01)

(58) Field of Classification Search
  CPC ............... G02B 6/12004; G02B 6/131; G02B 2006/12097; H01L 31/125
  See application file for complete search history.

(56) References Cited

U.S. PATENT DOCUMENTS

| 5,987,196 | A | * | 11/1999 | Noble | ................ | G02B 6/12004 |
| | | | | | | 257/E27.128 |
| 6,635,543 | B2 | * | 10/2003 | Furukawa | ......... | H01L 21/76262 |
| | | | | | | 257/E21.562 |
| 7,266,263 | B2 | | 9/2007 | Ahn et al. | | |
| 7,961,990 | B2 | * | 6/2011 | Krishnamoorthy | ...... | G02B 6/43 |
| | | | | | | 385/129 |

(Continued)

OTHER PUBLICATIONS

Vilson R. Almeida et al., "Nano-Taper for Compact Mode Conversion", School of Electrical and Computer Engineering, Cornell University, 2002, pp. 1-11.

(Continued)

*Primary Examiner* — Daniel Petkovsek
(74) *Attorney, Agent, or Firm* — Gibb & Riley, LLC; Michael J. LeStrange, Esq.

(57) ABSTRACT

Disclosed are non-planar monolithic hybrid optoelectronic structures. These structures are referred to as non-planar because they contain one or more semiconductor fins. These structures are referred to as monolithic because they contain, within each semiconductor fin, an optical waveguide core positioned laterally between a light sensor and a photodetector. Specifically, each semiconductor fin has end portions and a center portion positioned laterally between the end portions. The center portion is an optical waveguide core and the end portions have trenches that contain the light source and photodetector, respectively. These structures are referred to as hybrid because the optical waveguide core is made of one semiconductor material and the light sensor and (Continued)

photodetector are each made of at least one additional semiconductor material that is different from the semiconductor material of the center portion. Also disclosed herein are methods of forming monolithic non-planar hybrid optoelectronic structures.

19 Claims, 24 Drawing Sheets

(56) References Cited

U.S. PATENT DOCUMENTS

| | | | |
|---|---|---|---|
| 8,343,792 | B2 | 1/2013 | Carothers et al. |
| 8,508,008 | B2* | 8/2013 | Griebenow ........ G02B 6/12004 257/431 |
| 8,673,718 | B2 | 3/2014 | Maszara et al. |
| 8,731,017 | B2 | 5/2014 | Clifton et al. |
| 9,034,724 | B2* | 5/2015 | Meade ................ G02B 6/136 257/506 |
| 9,240,342 | B2 | 1/2016 | Jacob et al. |
| 9,293,448 | B2* | 3/2016 | Nguyen ............... H01L 25/167 |
| 9,318,622 | B1 | 4/2016 | Logan et al. |
| 9,323,079 | B1* | 4/2016 | Feng ..................... G02F 1/025 |
| 9,356,163 | B1 | 5/2016 | Liu et al. |
| 2012/0287959 | A1* | 11/2012 | Tani ....................... H01L 33/34 372/45.01 |
| 2013/0039664 | A1* | 2/2013 | Clifton ................ H01L 31/0352 398/200 |
| 2013/0200431 | A1 | 8/2013 | Coimbatore Balram et al. |
| 2013/0284269 | A1 | 10/2013 | Clifton et al. |
| 2014/0175490 | A1 | 6/2014 | Suwa et al. |

OTHER PUBLICATIONS

Solomon Assefa et al., "CMOS-Integrated High-Speed MSM Germanium Waveguide Photodetector", Optics Express, vol. 18, No. 5, Mar. 1, 2010, pp. 4986-4999.
Shen Ren, "Ge/SiGe Quantum Well Waveguide Modulator for Optical Interconnect Systems", A Dissertation, Mar. 2011, pp. 1-138.
C. Angulo Barrios et al., "Electrooptic Modulation of Silicon-on-Insulator Submicrometer-Size Waveguide Devices", Journal of Lightwave Technology, vol. 21, No. 10, Oct. 2003, pp. 2332-2339.
John E. Bowers et al., "A Technology for Integrating Active Photonic Devices on SOI Wafers", Conference Indium Phosphide and Related Materials Conference, May 1, 2006, pp. 1-4.
Ozdal Boyraz et al., "Demonstration of a silicon Raman laser", Optics Express, vol. 12, No. 21, Oct. 18, 2004, pp. 5269-5273.
P. Cheben et al., "Polarization compensation in silicon-on-insulator arrayed waveguide grating devices", Proceedings of SPIE vol. 4293, 200, pp. 15-22.
Day et al., "Tapered Silicon Waveguides for Low Insertion Loss Highly-efficient High-Speed Electronic", OFC 2003, vol. 1, pp. 249-251.
Guang-Hua Duan et al., "Hybrid Wavelength-Tunable III-V Lasers on Silicon", SPIE Newsroom 2014, pp. 1-3.
Pieter Dumon et al., "Low-Loss SOI Photonic Wires and Ring Resonators Fabricated With Deep UV Lithography", IEEE Phototonics Technology Letters, vol. 16, No. 5, May 2004, pp. 1328-1330.
P. Kaspar et al., "Hybrid III-V/Silicon Lasers", Proceedings of SPIE—The International Society for Optical Engineering (Proceedings of SPIE), May 2014, pp. 1-8.
Xiyue Li et al., "Design Considerations of Baiaxially Tensile-Strained Germanium-on-Silicon Lasers",School of Electronic and Information Engineering, South China University of Technology, Guangzhou, Guangdong 510641, China, Physics 2015, pp. 1-12.
T.K. Liang et al., "Integrated Polarization Beam Splitter in High Index Contrast Silicon-on-Insulator Waveguides", IEEE Phototonics Technology Letters, vol. 17, No. 2, Feb. 2005, pp. 393-395.
B.E. Little et al., "Ultra-Compact Si—SiO2 Microring Resonator Optical Channel Dropping Filters", IEEE Photonics Technology Letters, vol. 10, No. 4, Apr. 1998, pp. 549-551.
Jifeng Liu et al., "Ge-on-Si Laser Operating At Room Temperature", Optic Letters, vol. 35, No. 5, Mar. 1, 2010, pp. 679-681.
Ju Hyung Nam et al., "Monolithic Integration of Germanium-On-Insulator P-I-N. Photodetector on Silicon", Optical Society of America, vol. 23, No. 12, 2015 pp. 1-8.
Wilson R. Almeida et al., "All-Optical Control of Light on a Silicon Chip", Nature Publishing Group, vol. 431, Oct. 28, 2004, pp. 1081-1084.
Ning Li et al., "Monolithic III-V on Silicon Plasmonic Nanolaser Structure for Optical Interconnects", Scientific Reports, 2015, pp. 1-9.
J. Bai et al., "Study of the Defect Elimination Mechanisms in Aspect Ratio Trapping Ge Growth", American Institute of Physics, Mar. 5, 2007, Abstract, p. 1.
C.E. Png et al., "Development of small Silicon modulators in Silicon-On-Insulator (SOI)", Proceedings of SPIE vol. 4997, 2003, pp. 190-197.
G. Roelkens et al., III-V/silicon Photonic Integrated Circuits for Communication Applications, Dec. 2010, pp. 1-2.
Shinichi Saito et al., "Towards Monolithic Integration of Germanium Light Sources on Silicon Chips", Semiconductor Science and Technology, vol. 31, 2016. pp. 1-19.
S. Saito et al., "Germanium Fin Light-Emitting Diode", Applied Physics Letters, vol. 99, No. 241105, 2011, pp. 1-4.
P. D. Waldron et al., "Optical modulator in silicon-on-insulator with a low thermal signature," J. Vac. Sci. Technol. A, vol. 22, 2004pp. 800-802.

* cited by examiner

Alternating layers of Ge or SiGe and Ge or SiGe QWs

Alternating layers of III-V and III-V QWs (InGaAs/InAs QWs)

Alternating layers of SiGe and SiGe QWs with Ge QDs embedded in the QWs

Alternating layers of III-V and III-V QWs (InGaAs/InGaAs QWs) with III-V QDs (InAs QDs) embedded in the QWs Alternating layers of SiGe and Ge QW Alternating layers of III-V and III-V QW (InGasAs/InAs QW)

Alternating layers of SiGe and SiGe QWs with Ge QDs embedded in the QWs

Alternating layers of III-V and III-V QWs (InGaAs/InGaAs QWs) with III-V QDs (InAs QDs) embedded in the QWs

NON-PLANAR MONOLITHIC HYBRID OPTOELECTRONIC STRUCTURES AND METHODS

FIELD OF THE INVENTION

The structures and methods disclosed herein relate to optoelectronics and, more particularly, to hybrid optoelectronic structures that incorporate an optical waveguide between photonic devices (e.g., a light source and a photodetector) and methods of forming the structures.

BACKGROUND

Generally, in optoelectronics and, particularly, in optoelectronic integrated circuits, an optical waveguide captures an optical signal from a light source and transmits the optical signal to a photodetector (also referred to herein as a photosensor or optical receiver), which converts the optical signal to an electrical signal. Typically, the optical waveguide of such an optoelectronic structure will be made of a different semiconductor material than the light source and photodetector. For example, silicon is often used as the core material for the optical waveguide because silicon is transparent to optical signals in the infrared wavelength bands and germanium, silicon germanium or III-V compound semiconductor materials are often used for the light source and photodetector because these materials absorb optical signals in those same infrared wavelength bands. When different semiconductor materials are incorporated into the same optoelectronic structure, the structure is referred to in the art as a hybrid optoelectronic structure. Current techniques for forming such hybrid optoelectronic structures provide for forming an optical waveguide such that it has a first end adjacent to the light source and a second end, which is opposite the first end, adjacent to the photodetector. Since, in the hybrid optoelectronic structure, the light source and photodetector are formed with different semiconductor materials than the optical waveguide, they are also usually formed at a different level on the chip than the optical waveguide (e.g., above or below the ends of the optical waveguide). Forming the light source and photodetector on a different level of the chip than the optical waveguide limits size scaling of the optoelectronic structure.

SUMMARY

In view of the foregoing, disclosed herein are non-planar monolithic hybrid optoelectronic structures. These structures are referred to as non-planar because they contain one or more semiconductor fins. These structures are referred to as monolithic because they contain, within each semiconductor fin, an optical waveguide core positioned laterally between photonic devices including a light sensor and a photodetector. Specifically, each semiconductor fin has end portions and a center portion positioned laterally between the end portions. The center portion is an optical waveguide core and the end portions have trenches that contain the photonic devices. These structures are referred to as hybrid because the optical waveguide core is made of one semiconductor material and the photonic devices are each made of at least one additional semiconductor material that is different from the semiconductor material of the center portion. Also disclosed herein are methods of forming monolithic non-planar hybrid optoelectronic structures.

More particularly, disclosed herein are non-planar monolithic hybrid optoelectronic structures.

Each non-planar monolithic hybrid optoelectronic structure disclosed can include a semiconductor substrate, an insulator layer on the semiconductor substrate and one or more semiconductor fins above the insulator layer. A dielectric layer can also be on the insulator layer, laterally surrounding the semiconductor fin(s) and, in the case of multiple semiconductor fins, filling the spaces between the semiconductor fins.

Each semiconductor fin can have end portions and a center portion positioned laterally between the end portions. The center portion can be made of a semiconductor material and can form the core of an optical waveguide (i.e., an optical waveguide core). The end portions can have photonic devices, such as a light source and a photodetector, contained within trenches. Specifically, trenches can extend vertically into the end portions of each semiconductor fin and the photonic devices can be contained within the trenches. Each photonic device in each trench can include at least one additional semiconductor material that is different from the semiconductor material of the optical waveguide and that is epitaxially grown within the trench. The seed layer for epitaxially growing the additional semiconductor material(s) in the trenches can be a semiconductor surface at the bottoms of the trenches.

Thus, in one embodiment of the non-planar monolithic hybrid optoelectronic structure, the trenches can have the same depth and, specifically, can extend vertically into the end portions of the semiconductor fin(s) such that the bottoms of the trenches are above and physically separated from the top surface of the insulator layer. In this case, the photonic devices are contained within the trenches above and immediately adjacent to remaining portions of the semiconductor fin(s) below the trenches. In another embodiment of the non-planar monolithic hybrid optoelectronic structure, the trenches can have the same depth and, specifically, can extend vertically completely through the end portions of the semiconductor fin(s) and also through the insulator layer to the semiconductor substrate such that the bottoms of the trenches are at or below the top surface of the semiconductor substrate. In this case, the photonic devices are contained within the trenches and effectively form replacement end portions, which replace original end portions of the semiconductor fin(s) that were completely etched away during trench formation. In yet another embodiment of the non-planar monolithic hybrid optoelectronic structure, the trenches can have different depths and, specifically, a first trench containing a first photonic device can extend vertically into a first end portion such that the bottom of that first trench is above and physically separated from the top surface of the insulator layer (e.g., as in the first structure embodiment described above) and a second trench containing a second photonic device can extend vertically completely through a second end portion and the insulator layer such that the bottom of the second trench is at or below the top surface of the semiconductor substrate (e.g., as in the second structure embodiment described above).

Regardless of the structure embodiment, the semiconductor material of the optical waveguide core at the center portion of each semiconductor fins can be a semiconductor material that is transparent to optical signals in specific wavelength bands. Furthermore, the additional semiconductor material(s) of the photonic devices can be semiconductor material(s) that absorb light in those same wavelength bands. For example, the semiconductor material of the optical waveguide core at the center portion of each semiconductor fin can be silicon, which is transparent to light in the infrared wavelength bands, and the additional semiconductor material(s) of the photonic devices can be germanium, silicon germanium, and/or III-V compound semiconductor materials, which absorb optical signals in those same infrared wavelength bands. It should be noted that the additional semiconductor material(s) of the photonic devices (i.e., of the light source and the photodetector) may be the same or different. For example, the photonic devices may both be made of germanium or silicon germanium; the photonic devices may both be made of the same III-V compound semiconductor materials; one photonic device may be made of germanium or silicon germanium and the other may be made of III-V compound semiconductor material(s); the photonic devices may be made of different III-V compound semiconductor materials; etc.

Also disclosed herein are methods for forming the above-described non-planar monolithic hybrid optoelectronic structures.

In the methods, one or more semiconductor fins can be formed on an insulator layer above a semiconductor substrate. The semiconductor fin(s) can be made of a semiconductor material suitable for use an optical waveguide core. A dielectric layer can be formed over the semiconductor fin(s) and, in the case of multiple semiconductor fins, can fill the spaces between the semiconductor fins. The dielectric layer can be planarized to expose the top surface(s) of the semiconductor fin(s) such that a remaining portion of the dielectric layer laterally surrounds the semiconductor fin(s). Next, trenches can be formed in the end portions of each semiconductor fin and photonic devices can be formed in the trenches.

Each photonic device formed in each trench can be formed and, particularly, epitaxially grown so as to include at least one additional semiconductor material that is different from the semiconductor material of the optical waveguide. The seed layer for epitaxially growing the additional semiconductor material(s) in the trenches can be a semiconductor surface at the bottoms of the trenches.

Thus, in one embodiment of the method, the trenches can be formed so that they have the same depth and, specifically, so that they extend vertically into the end portions of the semiconductor fin(s) such that the bottoms of the trenches are above and physically separated from the top surface of the insulator layer. In this case, the additional semiconductor material(s) for the photonic devices are epitaxially grown within the trenches above and immediately adjacent to remaining portions of the semiconductor fin(s) below the trenches. In another embodiment of the method, the trenches can be formed so that they have the same depth and, specifically, so that they extend vertically completely through the end portions of the semiconductor fin(s) and also through the insulator layer to the semiconductor substrate such that the bottoms of the trenches are at or below the top surface of the semiconductor substrate. In this case, the additional semiconductor material(s) for the photonic devices can be grown within the trenches above and immediately adjacent to the semiconductor substrate or, alternatively, an initial epitaxial semiconductor layer (e.g., an epitaxial silicon layer) can be grown within the trenches above and immediately adjacent to the semiconductor substrate and the additional semiconductor material(s) for the photonic devices can be grown within the trenches on the initial epitaxial semiconductor layer. Thus, the photonic devices contained within the trenches effectively form replacement end portions, which replace the original end portions of the semiconductor fin(s) that were completely etched away during trench formation. In yet another embodiment of the method, the trenches can be formed so that they have different depths and, specifically, so that each semiconductor fin has a first trench that extends vertically into a first end portion such that the bottom of that first trench is above and physically separated from the top surface of the insulator layer (e.g., as in the first method embodiment described above) and a second trench that extends vertically completely through a second end portion and the insulator layer such that the bottom of the second trench is at or below the top surface of the semiconductor substrate (e.g., as in the second method embodiment described above).

Regardless of the method embodiment, the semiconductor material used to initially form the semiconductor fin(s) and, thereby the optical waveguide core at the center portion of each semiconductor fin can be a semiconductor material that is transparent to optical signals in specific wavelength bands. The additional semiconductor material(s) used to form the photonic devices can be semiconductor material(s) that absorb light in those same specific wavelength bands. For example, the semiconductor material used to initially form the semiconductor fin(s) and, thereby the optical waveguide core at the center portion of each semiconductor fin can be silicon, which is transparent to light in the infrared wavelength bands, and the additional semiconductor material(s) used to form the photonic devices can be germanium, silicon germanium and/or III-V compound semiconductor materials, which absorb optical signals in those same infrared wavelength bands. It should be noted that the photonic devices may be formed using the same epitaxial deposition processes such that the additional semiconductor material(s) of each of the photonic devices (i.e., of the light source and the photodetector) are the same. Alternatively, the photonic device may be formed using discrete epitaxial deposition processes such that the additional semiconductor material(s) of each of the photonic devices (i.e., of the light source and the photodetector) are different. Thus, for example, if the same epitaxial deposition processes is used, the photonic devices may both be made of germanium, silicon germanium or the same III-V compound semiconductor materials. However, if discrete epitaxial deposition processes are used, different materials may be used. For example, the photonic devices may both be made of germanium or silicon germanium; the photonic devices may both be made of the same III-V compound semiconductor materials; one photonic device may be made of germanium or silicon germanium and the other may be made of III-V compound semiconductor material(s); the photonic devices may be made of different III-V compound semiconductor materials; etc.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, generally, in optoelectronic integrated circuits, an optical waveguide captures an optical signal from a light source and transmits the optical signal to a photodetector (also referred to herein as a photosensor or optical receiver), which converts the optical signal to an electrical signal. Typically, the optical waveguide of such an optoelectronic structure will be made of a different semiconductor material than the light source and photodetector. For example, silicon is often used as the core material for the optical waveguide because silicon is transparent to optical signals in the infrared wavelength bands and germanium, silicon germanium or III-V compound semiconductor materials are often used for the light source and photodetector because these materials absorb optical signals in those same infrared wavelength bands. When different semiconductor materials are incorporated into the same optoelectronic structure, the structure is referred to in the art as a hybrid optoelectronic structure. Current techniques for forming such hybrid optoelectronic structures provide for forming an optical waveguide such that it has a first end adjacent to the light source and a second end, which is opposite the first end, adjacent to the photodetector. Since, in the hybrid optoelectronic structure, the light source and photodetector are formed with different semiconductor materials than the optical waveguide, they are also usually formed at a different level on the chip than the optical waveguide (e.g., above or below the ends of the optical waveguide). Forming the light source and photodetector on a different level of the chip than the optical waveguide limits size scaling of the optoelectronic structure.

In view of the foregoing, disclosed herein are non-planar monolithic hybrid optoelectronic structures. These structures are referred to as non-planar because they contain one or more semiconductor fins. These structures are referred to as monolithic because they contain, within each semiconductor fin, an optical waveguide core positioned laterally between photonic devices including a light sensor and a photodetector. Specifically, each semiconductor fin has end portions and a center portion positioned laterally between the end portions. The center portion is an optical waveguide core and the end portions have trenches that contain the photonic devices. These structures are referred to as hybrid because the optical waveguide core is made of one semiconductor material and the photonic devices are each made of at least one additional semiconductor material that is different from the semiconductor material of the center portion. Also disclosed herein are methods of forming monolithic non-planar hybrid optoelectronic structures.

Figure 1:
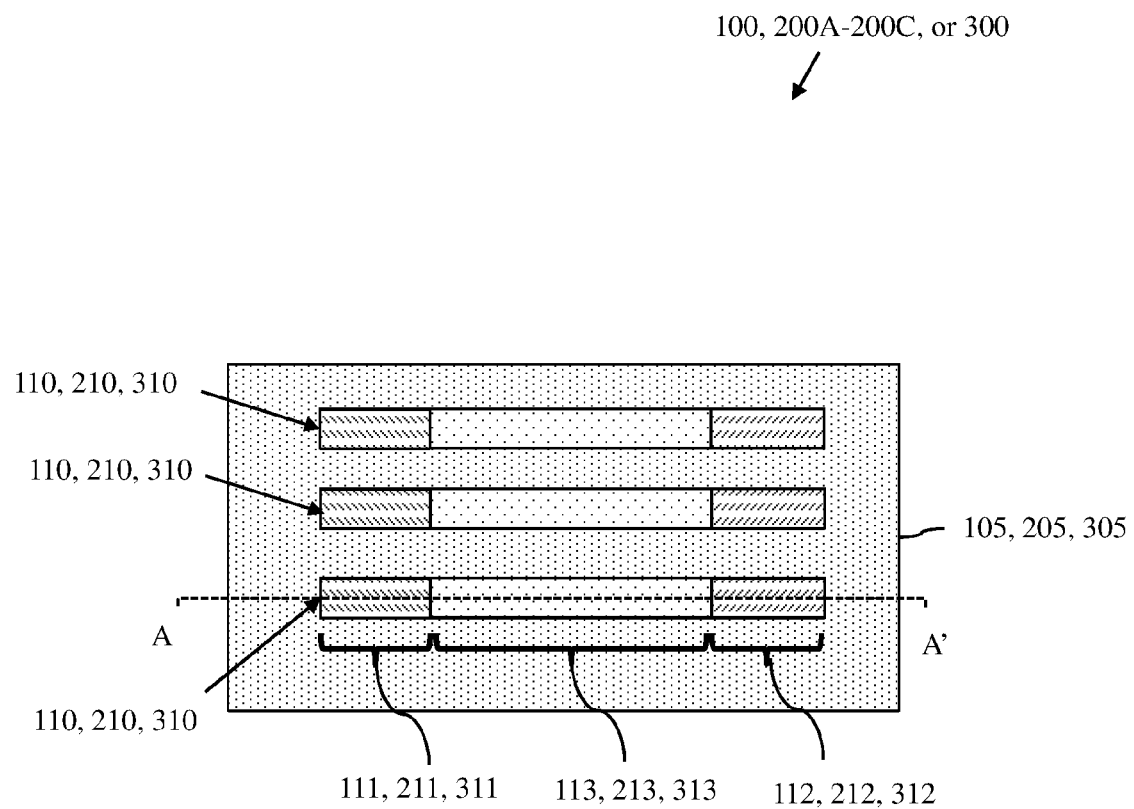
FIG. 1 is a top view diagram of various non-planar monolithic hybrid optoelectronic structures disclosed herein.
Figure 2:
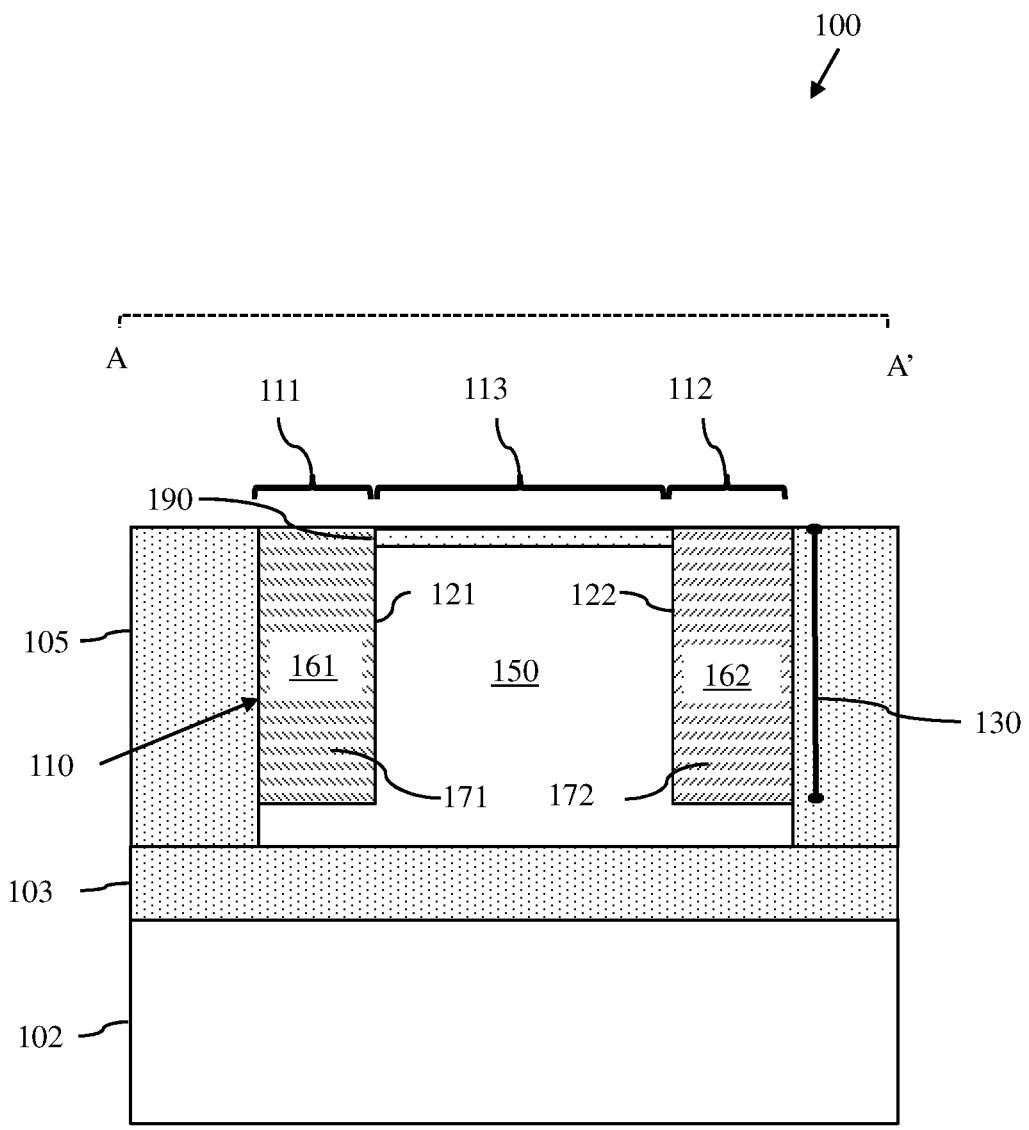
FIG. 2 is a cross-section diagram of a semiconductor fin of one disclosed non-planar monolithic hybrid optoelectronic structure.
Figure 3:
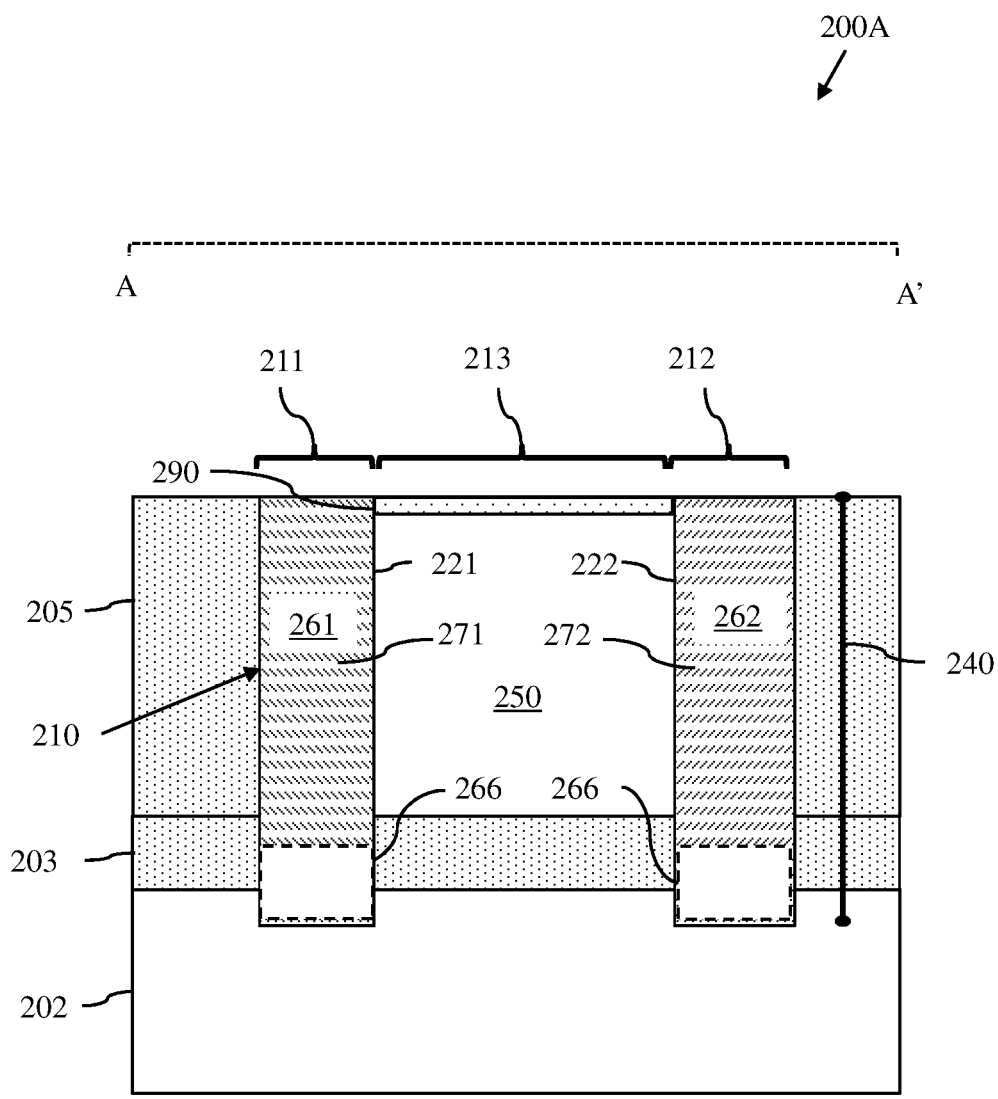
FIG. 3 is a cross-section diagram of a semiconductor fin of another disclosed non-planar monolithic hybrid optoelectronic structure.
Figure 4:
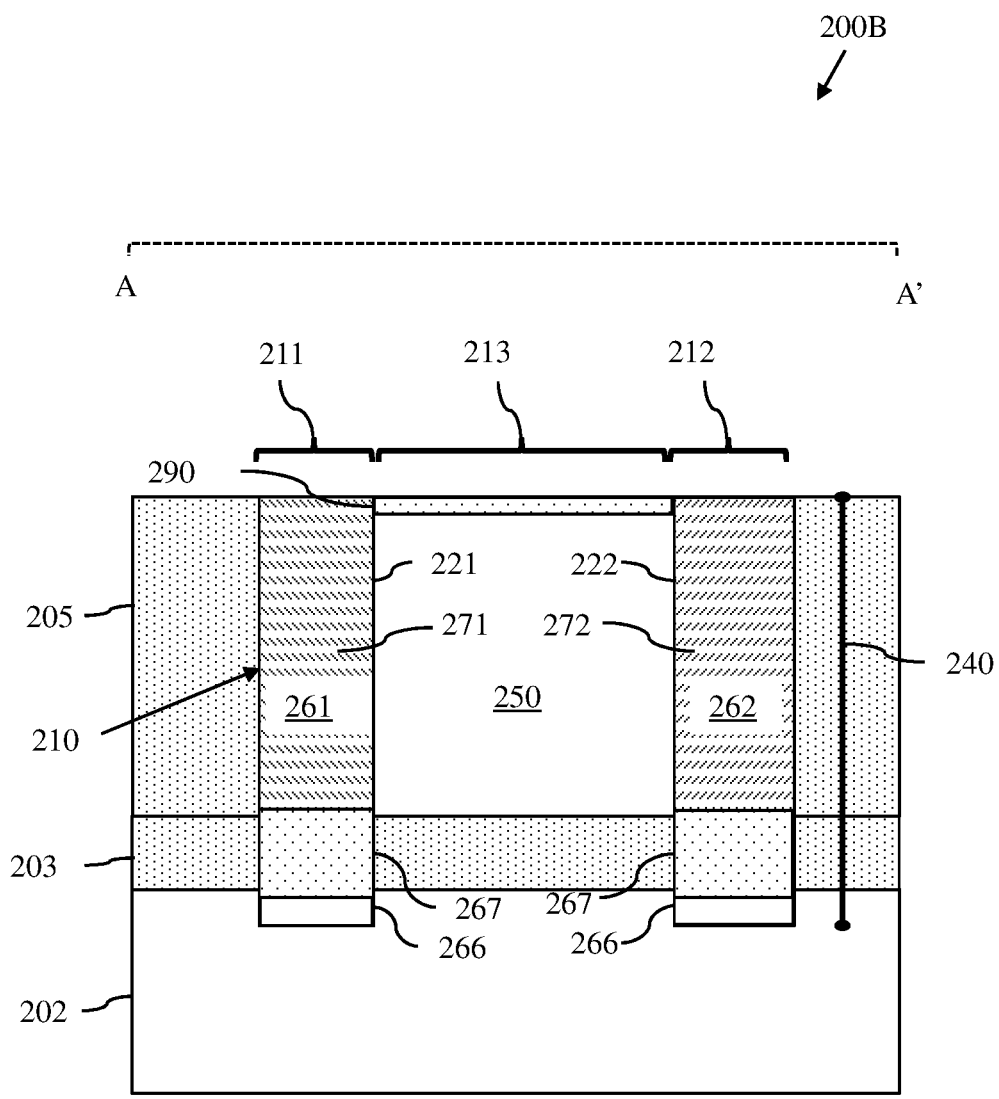
FIG. 4 is a cross-section diagram of a semiconductor fin of yet another disclosed non-planar monolithic hybrid optoelectronic structure.
Figure 5:
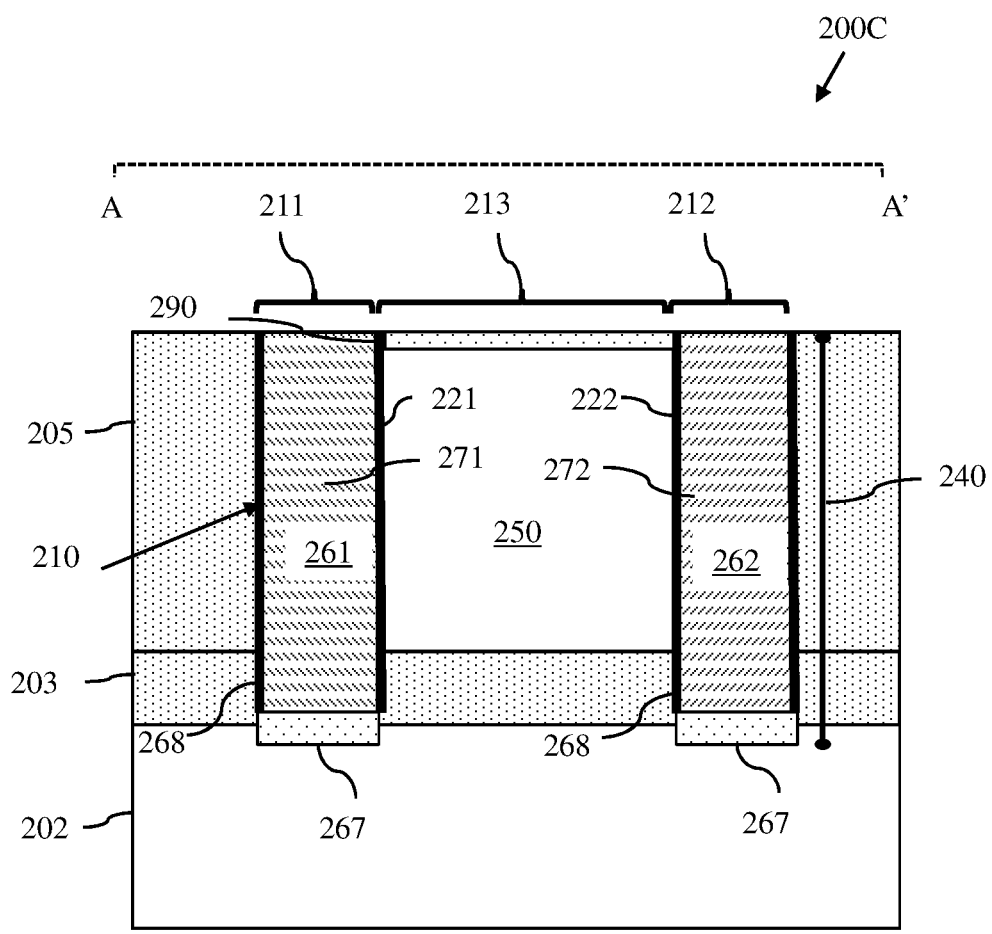
FIG. 5 is a cross-section diagram of a semiconductor fin of yet another disclosed non-planar monolithic hybrid optoelectronic structure.
Figure 6:
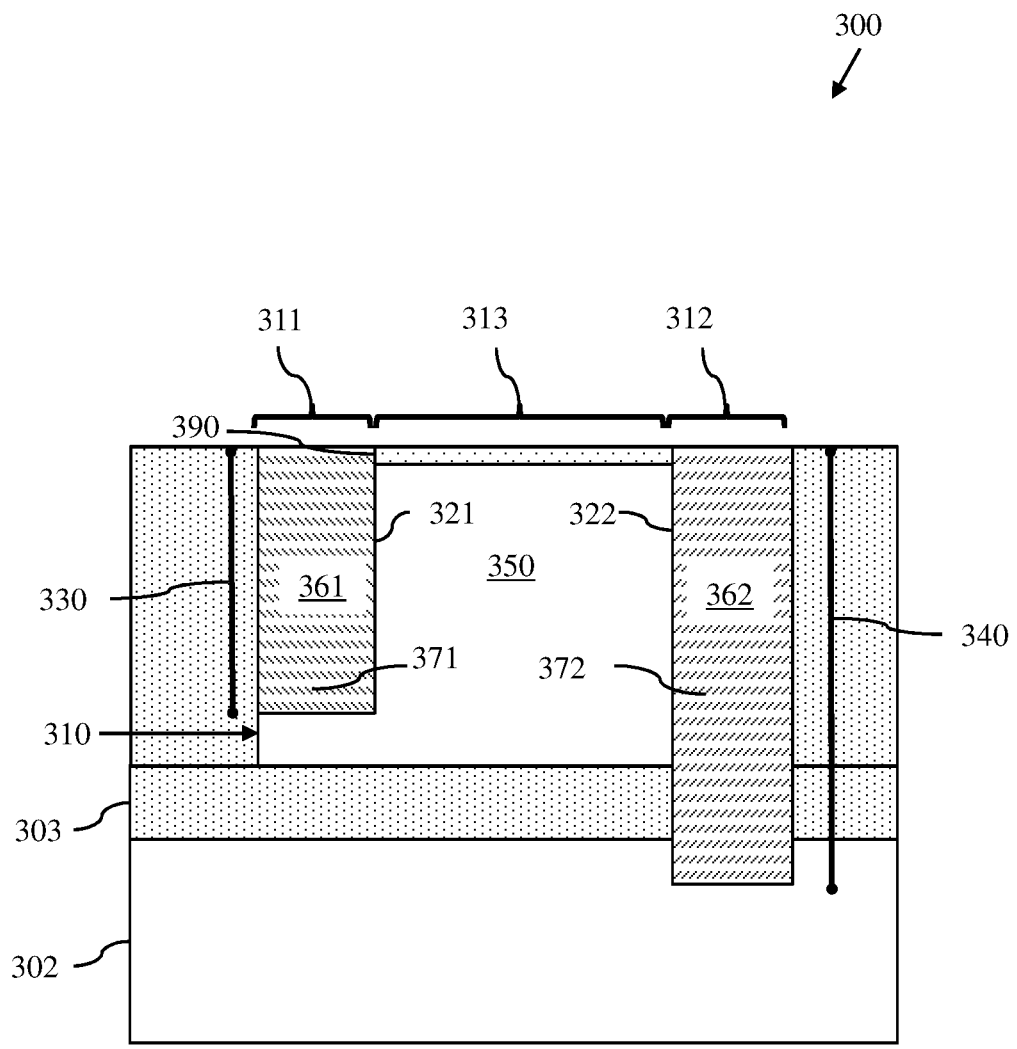
FIG. 6 is a cross-section diagram of a semiconductor fin of yet another disclosed non-planar monolithic hybrid optoelectronic structure.

More particularly, FIG. 1 is a top view diagram illustrating the various non-planar monolithic hybrid optoelectronic structures 100, 200A, 200B, 200C and 300 disclosed herein. FIG. 2 is a cross-section diagram of a semiconductor fin 110 in the structure 100. FIG. 3 is a cross-section diagram of a semiconductor fin 210 in the structure 200A. FIG. 4 is a cross-section diagram of a semiconductor fin 210 in the structure 200B. FIG. 5 is a cross-section diagram of a semiconductor fin 210 in the structure 200C. FIG. 6 is a cross-section diagram of a semiconductor fin 310 in the structure 300.

Each non-planar monolithic hybrid optoelectronic structure disclosed herein (i.e., structure 100 of FIG. 2, structure 200A of FIG. 3, structure 200B of FIG. 4, structure 200C of FIG. 5 and structure 300 of FIG. 6) can include a semiconductor substrate 102, 202, 302. The semiconductor substrate 102, 202, 302 can be a silicon substrate or any other suitable semiconductor substrate.

Each non-planar monolithic hybrid optoelectronic structure disclosed herein (i.e., structure 100 of FIG. 2, structure 200A of FIG. 3, structure 200B of FIG. 4, structure 200C of FIG. 5 and structure 300 of FIG. 6) can further include an insulator layer 103, 203, 303 on the semiconductor substrate 102, 202, 302. The insulator layer 103, 203, 303 can be a silicon dioxide (SiO2) layer or any other suitable insulator layer.

Each non-planar monolithic hybrid optoelectronic structure disclosed herein (i.e., structure 100 of FIG. 2, structure 200A of FIG. 3, structure 200B of FIG. 4, structure 200C of FIG. 5 and structure 300 of FIG. 6) can further include one or more semiconductor fins 110, 210, 310 on the insulator layer 103, 203, 303. The semiconductor fin(s) 110, 210, 310 can each have an essentially uniform width and height from a first end to a second end opposite the first end. The semiconductor fin(s) 110, 210, 310 can, for example, have a height that ranges from 100 nm to 1000 nm and a width that ranges from 10 nm to 300 nm. The semiconductor fin(s) 110, 210, 310 can each have an essentially planar top surface from the first end to the second end; however, due to the processing techniques used to form such fin(s), the edges and corners of the top surface may be rounded. For purposes of illustration, three semiconductor fins 110, 210, 310 are shown in the Figures; however, it should be understood that the Figures are not intended to be limiting and that the disclosed optoelectronic structures can have any number of one or more semiconductor fins. It should be noted that the number of fins could vary depending upon the fin width. For example, only a single fin could be used if the fin width was 300 nm, whereas 30 fins might be needed if the fin width was only 10 nm.

Each semiconductor fin 110, 210, 310 can have end portions 111-112, 211-212, 311-312 and a center portion 113, 213, 313, which is positioned laterally between the end portions 111-112, 211-212, 311-312.

The center portion 113, 213, 313 of each semiconductor fin 110, 210, 310 can be made of a semiconductor material that is a light-transmissive semiconductor material and, particularly, a semiconductor material that is transparent to optical signals in specific wavelength bands. For example, the center portion 113, 213, 313 of each semiconductor fin 110, 210, 310 can be made of silicon, which is transparent to light in the infrared wavelength bands. Thus, the center portion 113, 213, 313 of each semiconductor fin 110, 210, 310 can form the core 150, 250, 350 of an optical waveguide (i.e., an optical waveguide core).

The end portions 111-112, 211-212, 311-312 of each semiconductor fin 110, 210, 310 can have photonic devices 161-162, 261-262, 361-362, which are contained within trenches 121-122, 221-222, 321-322, respectively, and which are coupled to the optical waveguide core 150, 250, 350. The photonic devices can be, for example, a light source 161, 261, 361 and a photodetector 162, 262, 362. More specifically, a first trench 121, 221, 321 can extend vertically into a first end portion 111, 211, 311 of each semiconductor fin 110, 210, 310 and that first trench 121, 221, 321 can contain a light source 161, 261, 361. Additionally, a second trench 122, 222, 322 can extend vertically into a second end portion 112 of each semiconductor fin opposite the first end portion and that second trench 122, 222, 322 can contain a photodetector 162, 262, 362.

The photonic devices can each be made up of at least one additional semiconductor material that is epitaxially grown within the trenches and that is different from the semiconductor material of the optical waveguide core 150, 250, 350. Specifically, epitaxial layer(s) of at least one additional semiconductor material 171, 271, 371 can form the light source 161, 261, 361 in the first trench 121, 221, 321 of each semiconductor fin and epitaxial layer(s) of at least one additional semiconductor material 172, 272, 372 can form the photodetector 162, 262, 362 in the second trench 122, 222, 322 of each semiconductor fin. It should be noted that the additional semiconductor material(s) 171, 271, 371 of the light source 161, 261, 361 can be the same as the additional semiconductor material(s) 172, 272 372 of the photodetector 162, 262, 362. Alternatively, the additional semiconductor material(s) 171, 272, 371 of the light source 161, 261, 361 can be different from the additional semiconductor material (s) 172, 272, 372 of the photodetector 162, 262, 362.

In any case, the additional semiconductor material(s) of the light source 161, 261, 361 and the photodetector 162, 262, 362 can be different from the semiconductor material of the optical waveguide core 150, 250, 350. Specifically, as mentioned above, the semiconductor material of the optical waveguide core 150, 250, 350 is transparent to specific wavelength bands. Contrarily, the additional semiconductor material(s) of the light source 161, 261, 361 and the photodetector 162, 262, 362 can be semiconductor material(s) that absorb light in those specific wavelength bands. Thus, for example, if the semiconductor material of the optical waveguide core 150, 250, 350 is silicon, which is transparent to optical signals in the infrared wavelength bands, the additional semiconductor material(s) of the light source 161, 261, 361 and the photodetector 162, 262, 362 can be germanium, silicon germanium and/or III-V compound semiconductor materials, which absorb optical signals in the infrared wavelength bands.

Various different light source and photodetector configurations are well known in the art and can be formed by epitaxial deposition of one or more layers of semiconductor materials, which are either in situ doped or subsequently implanted, to form the desired photonic device structure.

Figure 7A:
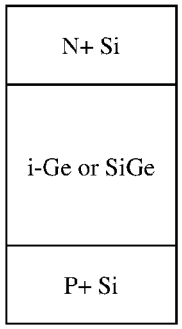
FIGS. 7A-7F are cross-section diagrams illustrating exemplary light sources that can be incorporated into the disclosed non-planar monolithic hybrid optoelectronic structures.
Figure 7B:
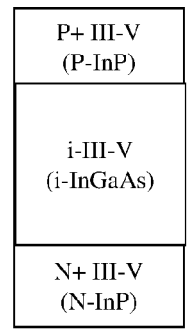
Figure 7C:
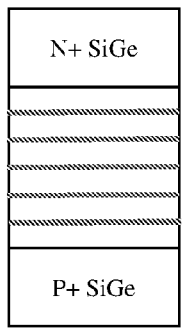
Figure 7D:
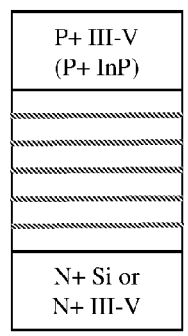
Figure 7E:
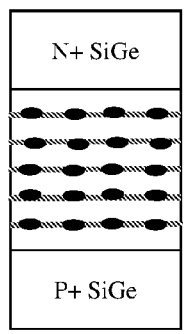
Figure 7F:
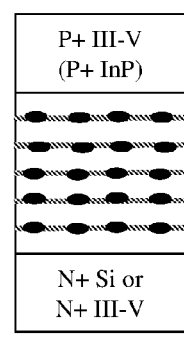

Exemplary light sources can include, but are not limited to, light emitting diodes, laser diodes and optical modulators. FIGS. 7A-7F show various different configurations for light sources that can be formed on the bottom surface of the trench 121, 221, 321, which, as discussed above, is a semiconductor surface, such as a silicon surface). FIG. 7A shows an exemplary light source 161, 261, 361 and, particularly, germanium (Ge)-based PIN light emitting diode (LED), wherein the first additional semiconductor materials 171, 271, 371 are: an epitaxial P+ silicon (Si) layer adjacent the bottom of the trench 121, 221, 321; an epitaxial intrinsic silicon germanium (SiGe) or Ge layer above the P+ Si layer; and an epitaxial N+ Si layer above the epitaxial intrinsic SiGe or Ge layer. FIG. 7B shows another exemplary light source 161, 261, 361 and, particularly, III-V-based PIN light emitting diode (LED), wherein the first additional semiconductor materials 171, 271, 371 are: an epitaxial N+ III-V compound semiconductor layer (e.g., an epitaxial N+ indium phosphide (InP) layer) adjacent the bottom of the trench 121, 221, 321; an epitaxial intrinsic III-V compound semiconductor layer (e.g., an epitaxial intrinsic indium gallium arsenide (InGaAs) layer) on the N+ III-V compound semiconductor layer; and an epitaxial P+ III-V compound layer (e.g., an epitaxial P+ InP layer) on the epitaxial intrinsic III-V compound layer. FIG. 7C shows yet another exemplary light source 161, 261, 361 and, particularly, a laser diode, wherein the first additional semiconductor materials 171, 271, 371 are: an epitaxial P+ SiGe layer adjacent the bottom of the trench 121, 221, 321; a quantum wells region on the epitaxial P+ SiGe layer, the quantum wells region including alternating layers of Ge or SiGe and Ge or SiGe quantum well layers; and an epitaxial N+ SiGe layer on the quantum wells region. It should be noted that in the laser diode of FIG. 7C, the epitaxial layers should be tensile strained (e.g., by a combination of annealing and cooling processes, which cause thermal shock and induce tensile strain). FIG. 7D shows yet another exemplary light source 161, 261, 361 and, particularly, a laser diode formed with III-V compounds semiconductor materials and a quantum wells region. In this case, the first additional semiconductor materials 171, 271, 371 are: an epitaxial N+ Si layer or N+ III-V compound semiconductor layer; a quantum wells region on the N+ Si or III-V compound semiconductor layer, the quantum wells region including alternating layers of a III-V compound semiconductor material and III-V quantum wells (e.g., alternating layers of InGaAs and indium arsenide (InAs) quantum wells); and, an epitaxial P+ III-V compound semiconductor layer (e.g., P+ InP) on the quantum wells region. FIG. 7E shows yet another exemplary light source 161, 261, 361 and, particularly, a laser diode, wherein the first additional semiconductor materials 171, 271, 371 are: an epitaxial P+ SiGe layer adjacent the bottom of the trench 121, 221, 321; a quantum wells/quantum dots region on the epitaxial P+ SiGe layer, the quantum wells/quantum dots region including alternating layers of SiGe and SiGe quantum wells with Ge quantum dots embedded in the quantum wells; and an epitaxial N+ SiGe layer on the quantum wells/quantum dots region. FIG. 7F shows yet another exemplary light source 161, 261, 361 and, particularly, a laser diode formed with III-V compounds semiconductor materials and a quantum wells/quantum dots region. In this case, the first additional semiconductor materials 171, 271, 371 are: an epitaxial N+ Si layer or N+ III-V compound semiconductor layer; a quantum wells/quantum dots region on the N+ Si or III-V compound semiconductor layer, the quantum wells/quantum dots region including alternating layers of a III-V compound semiconductor material and III-V quantum wells (e.g., alternating layers of InGaAs and InGaAs quantum wells) with III-V quantum dots (e.g., InAs quantum dots) embedded in the quantum wells; and, an epitaxial P+ III-V compound semiconductor layer (e.g., P+ InP) on the quantum wells/quantum dots region. It should be noted that the various layers could be either in situ doped during the epitaxial deposition process or subsequently implanted so as to have the desired conductivity.

Figure 8A:
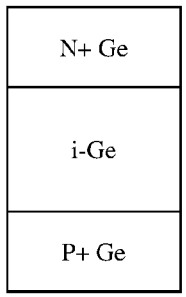
FIGS. 8A-8F are cross-section diagrams illustrating exemplary photodetectors that can be incorporated into the disclosed non-planar monolithic hybrid optoelectronic structures.
Figure 8B:
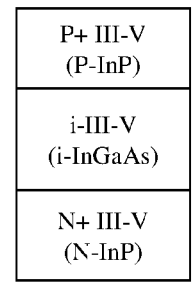
Figure 8C:
Figure 8D:
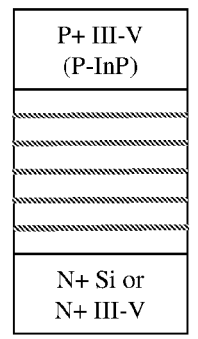
Figure 8E:
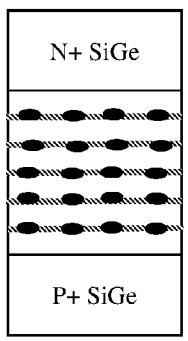
Figure 8F:
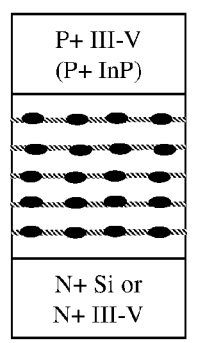

Exemplary photodetectors can include, but are not limited to, photodiodes. FIGS. 8A-8F show various different configurations for photodetectors that can be formed on the bottom surface of the trench 122, 222, 322, which, as discussed above, is a semiconductor surface, such as a silicon surface). For example, FIG. 8A shows an exemplary photodetector 162, 262, 362 that is a Ge-based PIN photodiode, wherein the second additional semiconductor materials 172, 272, 372 are: an epitaxial P+Ge layer adjacent the bottom of the trench 122, 222, 322; an epitaxial intrinsic Ge layer above the epitaxial P+Ge layer; and an epitaxial N+Ge layer above the epitaxial intrinsic Ge layer. FIG. 8B shows another exemplary photodetector 162, 262, 362 and, particularly, III-V-based PIN photodiode, wherein the second additional semiconductor materials 172, 272, 372 are: an epitaxial N+ III-V compound semiconductor layer (e.g., an epitaxial N+ InP layer) adjacent the bottom of the trench 122, 222, 322; an epitaxial intrinsic III-V compound semiconductor layer (e.g., an epitaxial intrinsic InGaAs layer) on the N+ III-V compound semiconductor layer; and an epitaxial P+ III-V compound semiconductor layer (e.g., an epitaxial P+ InP layer) on the epitaxial intrinsic III-V compound semiconductor layer. FIG. 8C shows yet another exemplary photodetector 162, 262, 362, wherein the second additional semiconductor materials 172, 272, 372 are: an epitaxial P+ Si layer adjacent the bottom of the trench 122, 222, 322; a quantum wells region on the epitaxial P+ Si layer, the quantum wells region including alternating layers of SiGe and Ge quantum well layers; and an epitaxial N+ SiGe layer on the quantum wells region. A photodetector could similarly be formed with III-V compound semiconductor materials and a quantum wells region, as shown in FIG. 8D. In this case, the first additional semiconductor materials 172, 272, 372 are: an epitaxial N+Si layer or N+ III-V compound semiconductor layer; a quantum wells region on the N+ Si or III-V compound semiconductor layer, the quantum wells region including alternating layers of a III-V compound semiconductor material and III-V quantum well layers (e.g., alternating layers of InGaAs and InAs quantum wells); and, an epitaxial P+ III-V compound semiconductor layer (e.g., P+ InP). FIG. 8E shows yet another exemplary photodetector 162, 262, 362, wherein the second additional semiconductor materials 172, 272, 372 are: an epitaxial P+ SiGe layer adjacent the bottom of the trench 122, 222, 322; a quantum wells/quantum dots region on the epitaxial P+ SiGe layer, the quantum wells/quantum dots region including alternating layers of SiGe and SiGe quantum wells with Ge quantum dots embedded in the quantum wells; and an epitaxial N+ SiGe layer on the quantum wells/quantum dots region. FIG. 8F shows yet another exemplary photodetector 162, 262, 362 formed with III-V compounds semiconductor materials and a quantum wells/quantum dots region. In this case, the second additional semiconductor materials 172, 272, 372 are: an epitaxial N+ Si layer or N+ III-V compound semiconductor layer; a quantum wells/quantum dots region on the N+ Si or III-V compound semiconductor layer, the quantum wells/quantum dots region including alternating layers of a III-V compound semiconductor material and III-V quantum wells (e.g., alternating layers of InGaAs and InGaAs quantum wells) with III-V quantum dots (e.g., InAs quantum dots) embedded in the quantum wells; and, an epitaxial P+ III-V compound semiconductor layer (e.g., P+ InP) on the quantum wells/quantum dots region. It should be noted that the various layers could be either in situ doped during the epitaxial deposition process or subsequently implanted so as to have the desired conductivity.

Optionally, any of the photonic devices described above and illustrated in FIGS. 7A-7F or 8A-8F can further incorporate either a relaxed buffer layer or a graded layer (not shown). For example, in the case of a Ge-based device, a relaxed buffer layer of Ge or a graded SiGe layer could be formed immediately adjacent to the bottom of the trench and the remaining layers of the device could be formed above this layer. In the case of a III-V compound semiconductorbased device, a relaxed buffer layer of a III-V compound semiconductor material (e.g., InP) or a graded III-V compound semiconductor layer could be formed immediately adjacent the bottom of the trench and the remaining layers can be formed above. Also, optionally, any of the photonic devices described above and illustrated in FIGS. 7A-7F or 8A-8F can further incorporate a Si cap as the uppermost layer.

In any case, it should be understood that a light source and a photodetector may have essentially the same configuration, as illustrated, or different configurations and may include the same types of semiconductor materials or different semiconductor materials. Furthermore, it should be understood that the exemplary light source and photodetector configurations described above and illustrated in FIGS. 7A-7F and 8A-8F are provided for illustration purposes and are not intended to be limiting. It is anticipated that any other light source and/or photodetector configuration that could be formed within a trench through epitaxial deposition and, if necessary, subsequent dopant implant processes could, alternatively, be incorporated into the optoelectronic structures disclosed herein.

In any case, at least one dielectric layer 105, 205, 305 can be on the insulator layer 103, 203, 303 such that it laterally surrounds each semiconductor fin 110, 210, 310 and, in the case of multiple semiconductor fins, such that it fills the spaces between the semiconductor fins 110, 210, 310. The at least one dielectric layer 105, 205, 305 can include, for example, a conformal silicon nitride (SiN) layer and a blanket silicon dioxide (SiO2) layer on the conformal SiN layer.

It should be noted that epitaxial deposition of the additional semiconductor material(s) for the photonic devices 161-162, 261-262, 361-362 requires a seed layer at the bottoms of the trenches 121-122, 221-222, 321-322 and, particularly, a semiconductor surface at the bottoms of the trenches 121-122, 221-222, 321-322. This semiconductor surface can be in the semiconductor fin itself (e.g., the non-planar monolithic hybrid optoelectronic structure 100 of FIG. 2), in the semiconductor substrate (e.g., see the non-planar monolithic hybrid optoelectronic structures 200A of FIG. 3, 200B of FIG. 4, or 200C of FIG. 5) or in a combination of both (e.g., in the semiconductor fin for one trench 321 and in the semiconductor substrate for the other trench 322, as in the non-planar monolithic hybrid optoelectronic structure 300 of FIG. 6).

More specifically, referring to the non-planar monolithic hybrid optoelectronic structure 100 of FIG. 2, in one embodiment the trenches 121-122 can have the same depth 130. Specifically, the trenches 121-122 can extend vertically into the end portions 111-112, respectively, of the semiconductor fin(s) 110 such that the bottoms of the trenches 121-122 are above and physically separated from the top surface of the insulator layer 103. In this case, the photonic devices 161-162 are contained within the trenches 121-122 above and immediately adjacent to remaining portions of the semiconductor fin(s) 110 below the trenches 121-122.

Referring to the non-planar monolithic hybrid optoelectronic structures 200A of FIG. 3, 200B of FIG. 4, or 200C of FIG. 5, in another embodiment the trenches 221-222 can have also have the same depth 240, which is significantly deeper than the depth 130 discussed above. Specifically, the trenches 221-222 can extend vertically completely through the end portions 211-212 of the semiconductor fin(s) 210 and also through the insulator layer 203 to the semiconductor substrate 202 below such that the bottoms of the trenches 221-222 are at or below the top surface of the semiconductor substrate 202. In this case, the photonic devices 261-262 are contained within the trenches 221-222 and effectively form replacement end portions, which replace original end portions of the semiconductor fin(s) 210 that were completely etched away during trench formation.

In this embodiment, before the additional semiconductor materials(s) 271-272 of the photonic devices 261-262 are epitaxially grown in the trenches 221-222, an epitaxial layer of silicon may, optionally, be grown on the exposed surface of the semiconductor substrate 202 within the trenches. Thus, as shown in FIG. 3, the non-planar monolithic hybrid optoelectronic structure 200A includes optional epitaxial silicon regions 266 in the trenches 221-222 between the semiconductor substrate 202 and the additional semiconductor material(s) 271-272 of the photonic devices 261-262.

It should be noted that, during processing, when the additional semiconductor material(s) 271-272 are epitaxially grown in the trenches 221-222 on a semiconductor surface, which is a different semiconductor material and which functions as a seed layer (e.g., on the semiconductor substrate 202 or, if applicable, on optional epitaxial silicon regions 266), defects may form adjacent to the interface between the different semiconductor materials (e.g., at the silicon to germanium, silicon germanium or III-V compound semiconductor material interface). Since that interface is exposed to the oxide material of the insulator layer 203, subsequent anneal processes may result in the formation of oxide regions 267 in the trenches 221-222 between the semiconductor substrate 203 and the photonic devices 261-262, as shown in the non-planar monolithic hybrid optoelectronic structure 200B of FIGS. 4 and 200C of FIG. 5. Optionally, the sidewalls of the trenches 221-222 may be lined with a protective layer 268 (e.g., a silicon nitride (SiN) layer or other suitable non-oxide protective layer), as shown in the non-planar monolithic hybrid optoelectronic structure 200C of FIG. 5. This protective layer 268 limits exposure of the interface to the oxide material of the insulator layer 203 and, thus, limits the thickness of the oxide regions 267 within the trenches 221-222 below the photonic devices 261-262.

Referring to the non-planar monolithic hybrid optoelectronic structure 300 of FIG. 6, in yet another embodiment the trenches 321-322 can have different depths. Specifically, a first trench 321 can extend vertically into a first end portion 311 of each semiconductor fin 310 to a first depth 330 such that the bottom of that first trench 321 is above and physically separated from the top surface of the insulator layer 303. Additionally, a second trench 322 can extend vertically completely through a second end portion 312 of each semiconductor fin 310 and through the insulator layer 303 to a second depth 340 such that the bottom of the second trench 322 is at or below the top surface of the semiconductor substrate. In this case, the photonic device 361 is contained within the first trench 321 above and immediately adjacent to remaining portion of the semiconductor fin(s) 310 below the trench 321 similar to the photonic device 161 of FIG. 2, whereas the photonic device 362 is contained within the second trench 321 and can have features similar to the photonic device 262 of FIGS. 3-5.

In any case, each non-planar monolithic hybrid optoelectronic structure disclosed herein (i.e., structure 100 of FIG. 2, structure 200A of FIG. 3, structure 200B of FIG. 4, structure 200C of FIG. 5 and structure 300 of FIG. 6) can further include a cap layer 190, 290, 390 covering the top surface of each semiconductor fin 110, 210, 310 between the photonic devices 161-162, 261-262 and 361-362. This cap layer 190, 290, 390 can be, for example, an oxide cap layer.

It should be understood that in each of the non-planar monolithic hybrid optoelectronic structures disclosed herein (i.e., structure 100 of FIG. 2, structure 200A of FIG. 3, structure 200B of FIG. 4, structure 200C of FIG. 5 and structure 300 of FIG. 6), the insulator layer 103, 203, 303 below the center portions 113, 213, 313 of semiconductor fin(s) 110, 210, 310, the dielectric layer 105, 205, 305 on the opposing sides of the semiconductor fin(s) 110, 210, 310 and the cap layer 190, 290, 390 above the center portions 113, 213, 313 of the semiconductor fin(s) 110, 210, 310 form the optical waveguide cladding around each optical waveguide core 150, 250, 350. Thus, the materials used for the insulator layer 103, 203, 303, the dielectric layer 105, 205, 305 and the cap layer 190, 290, 390 should be light-transmissive materials, but should have a lower refractive index than that of the semiconductor material of the optical waveguide core 150, 250, 350 so that light signals can be confined to and propagated along the optical waveguide core 150, 250, 350 from the light source 161, 261, 361 to the photodetector 162, 262, 362.

Each non-planar monolithic hybrid optoelectronic structure disclosed herein (i.e., structure 100 of FIG. 2, structure 200A of FIG. 3, structure 200B of FIG. 4, structure 200C of FIG. 5 and structure 300 of FIG. 6) can further include metal contacts (not shown) to the terminals of each of the photonic devices 161-162, 261-262, 361-362. Specifically, both the top epitaxial layer and the bottom epitaxial layer of each photonic device in each trench must be separately contacted. The arrangement of these contacts can vary depending upon the configuration of the photonic devices. For example, for a photonic device that is not electrically isolated from the semiconductor substrate, a first contact can land on the top surface of the photonic device and a second contact can extend through the shallow trench isolation region to the semiconductor substrate. For a photonic device that is electrically isolated from the substrate a first contact can land on the top surface of the photonic device and a second contact, which has sidewalls lined with isolation material can extend vertically through the photonic device to the bottom epitaxial layer.

Figure 9:
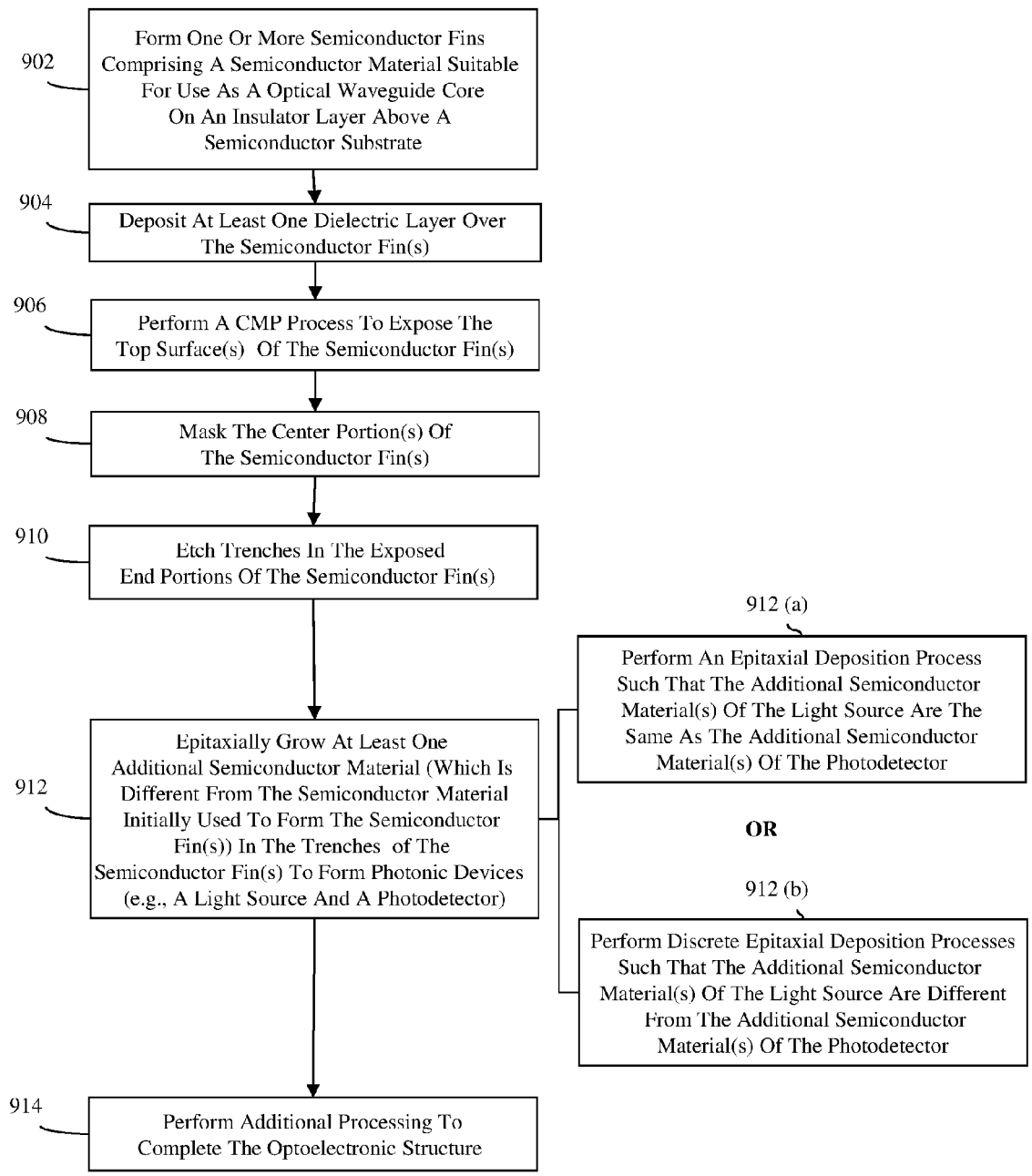
FIG. 9 is a flow diagram illustrating methods of forming the disclosed non-planar monolithic hybrid optoelectronic structures.
Figure 10:
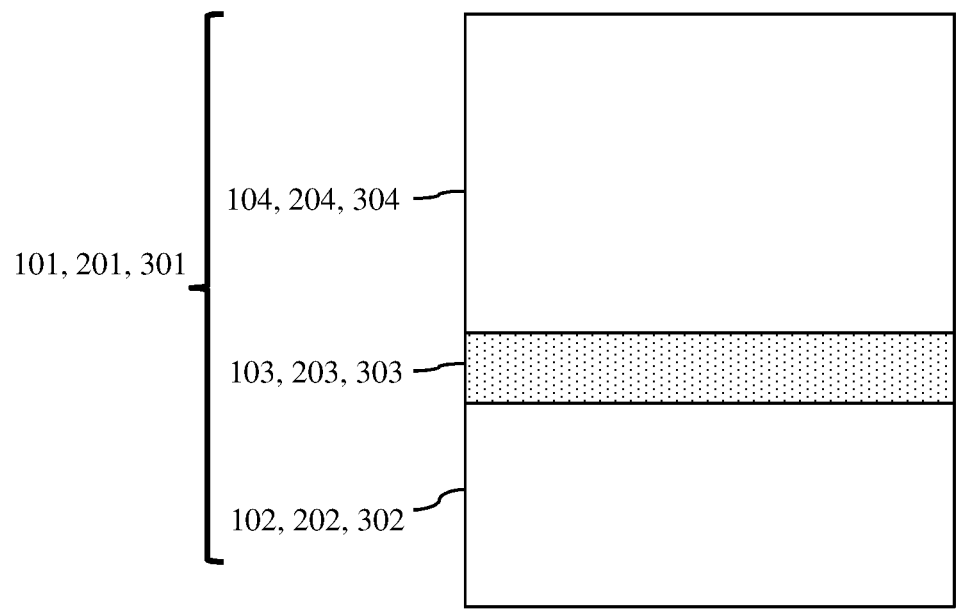
FIG. 10 is a cross-section diagram illustrating a partially completed non-planar monolithic hybrid optoelectronic structure.

Referring to the flow diagram of FIG. 9, also disclosed herein are methods for forming each of the above-described non-planar monolithic hybrid optoelectronic structures (i.e., structure 100 of FIG. 2, structure 200A of FIG. 3, structure 200B of FIG. 4, structure 200C of FIG. 5 and structure 300 of FIG. 6) on a semiconductor-on-insulator (SOI) wafer. Specifically, in the methods, a semiconductor-on-insulator (SOI) wafer 101, 201, 301 is provided. This SOI wafer 101, 201, 301 can have semiconductor substrate 102, 202, 302, an insulator layer 103, 203, 303 on the semiconductor substrate 102, 202, 302 and a semiconductor layer 104, 204, 304 on the insulator layer 103, 203, 303, as shown in FIG. 10. The semiconductor substrate 102, 202, 302 can be, for example, a silicon substrate or other suitable semiconductor substrate. The insulator layer 103, 203, 303 can be a silicon dioxide (SiO2) layer or any other suitable insulator layer. The semiconductor layer 104, 204, 304 can be a light-transmissive semiconductor layer (i.e., a layer of a semiconductor material that is transparent to optical signals in specific wavelength bands) so that it is suitable for use as an optical waveguide core. For example, the semiconductor layer 104, 204, 304 can be a silicon layer, which is transparent to light in the infrared wavelength bands.

Figure 11:
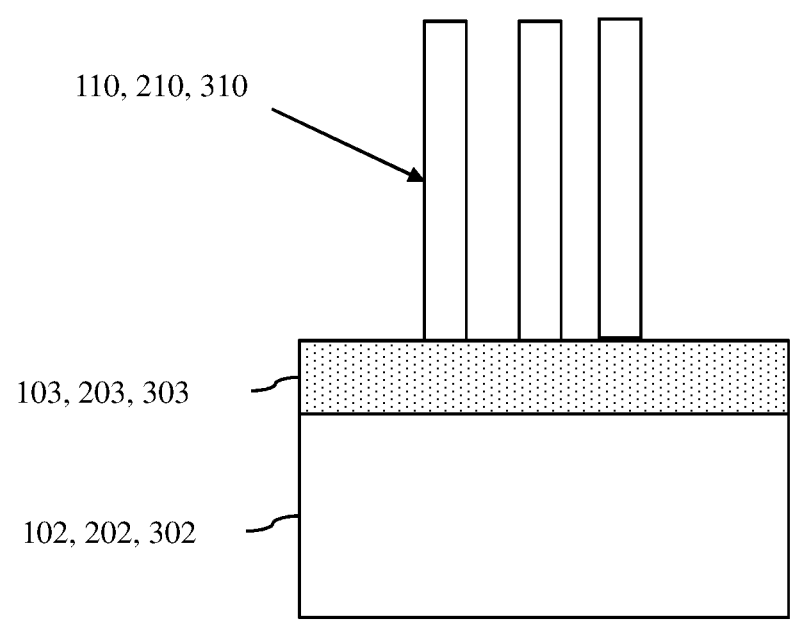
FIG. 11 is a cross-section diagram illustrating a partially completed non-planar monolithic hybrid optoelectronic structure.

In the methods, one or more semiconductor fins 110, 210, 310 can be formed from the semiconductor layer 104, 204, 304 (902, see FIG. 11). The semiconductor fin(s) 110, 210, 310 can be formed, for example, using lithographic patterning and etch techniques or sidewall image transfer (SIT) techniques. Such semiconductor fin formation techniques are well known in the art and, thus, the details have been omitted from this specification in order to allow the reader to focus on the salient aspects of the disclosed methods. In any case, the semiconductor fin(s) 110, 210, 310 should be formed so as to have an essentially uniform width from a first end to a second end opposite the first end. The semiconductor fin(s) 110, 210, 310 can, for example, be formed so as to have a height that ranges from 100 nm to 1000 nm and a width that ranges from 10 nm to 300 nm. The semiconductor fin(s) 110, 210, 310 should further be formed so as to have an essentially planar top surface from the first end to the second end. For purposes of illustration, three semiconductor fins 110, 210, 310 are shown in the Figures; however, it should be understood that the Figures are not intended to be limiting and that the disclosed optoelectronic structures can be formed so as to have any number of one or more semiconductor fins. It should be noted that the number of fins could vary depending upon the fin width. For example, only a single fin could be used if the fin width was 300 nm, whereas 30 fins might be needed if the fin width was only 10 nm.

Figure 12:
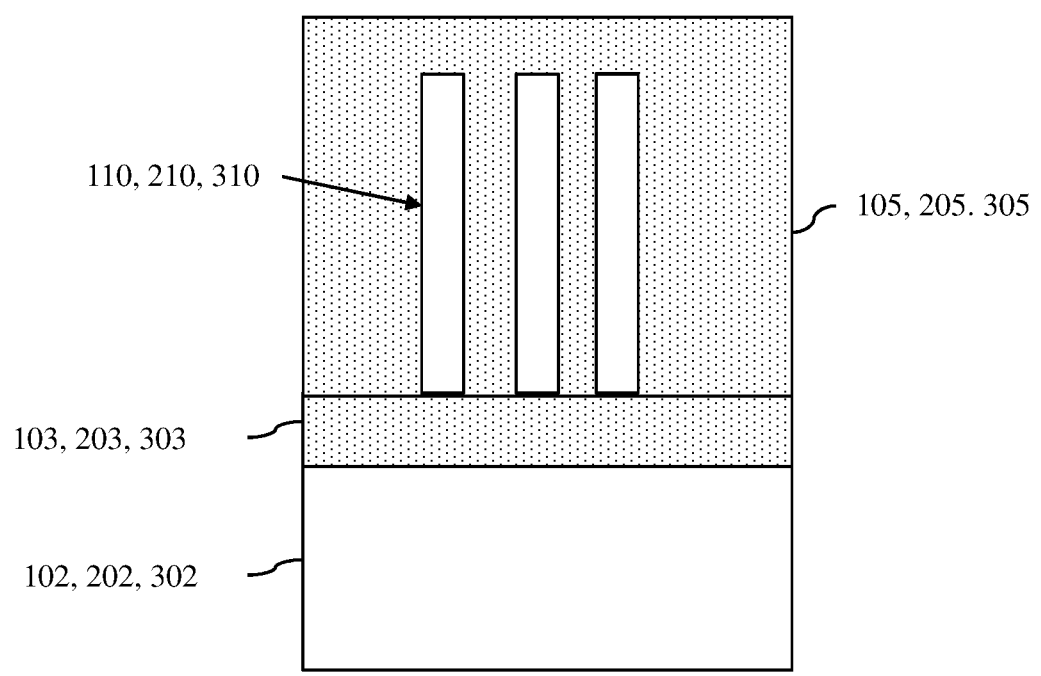
FIG. 12 is a cross-section diagram illustrating a partially completed non-planar monolithic hybrid optoelectronic structure.

Next, at least one dielectric layer 105, 205, 305 can be formed (e.g., deposited) over the semiconductor fin(s) 110, 210, 310 and, in the case of multiple semiconductor fins, can fill the spaces between the semiconductor fins 110, 210, 310 (904, see FIG. 12). The at least one dielectric layer 105, 205, 305 deposited at process 904 can include, for example, a conformal silicon nitride (SiN) layer and a blanket silicon dioxide (SiO2) layer on the conformal SiN layer.

Figure 13A:
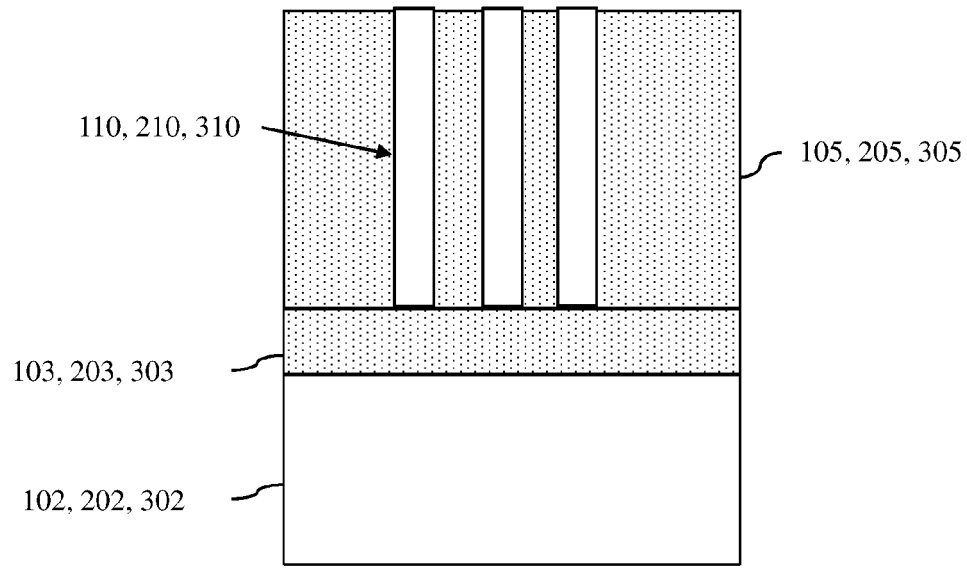
FIG. 13A is a cross-section diagram illustrating a partially completed non-planar monolithic hybrid optoelectronic structure.
Figure 13B:
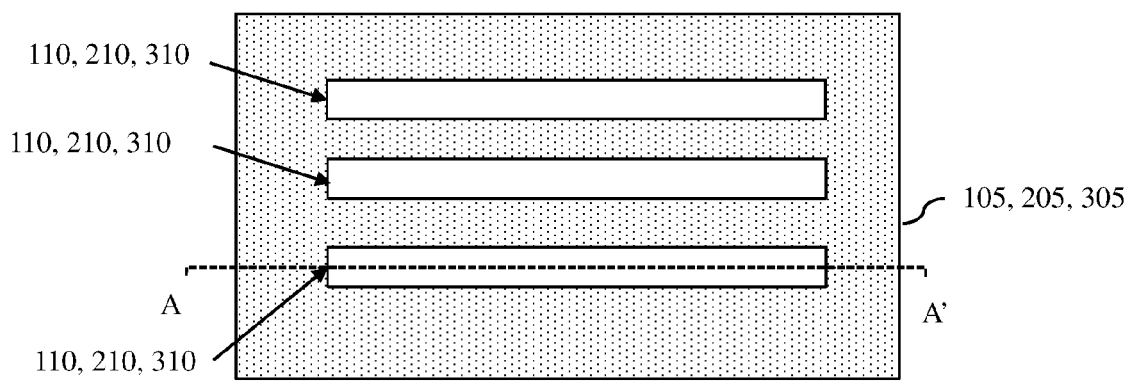
FIG. 13B is a top view diagram illustrating the partially completed non-planar monolithic hybrid optoelectronic structure of FIG. 13A.
Figure 13C:
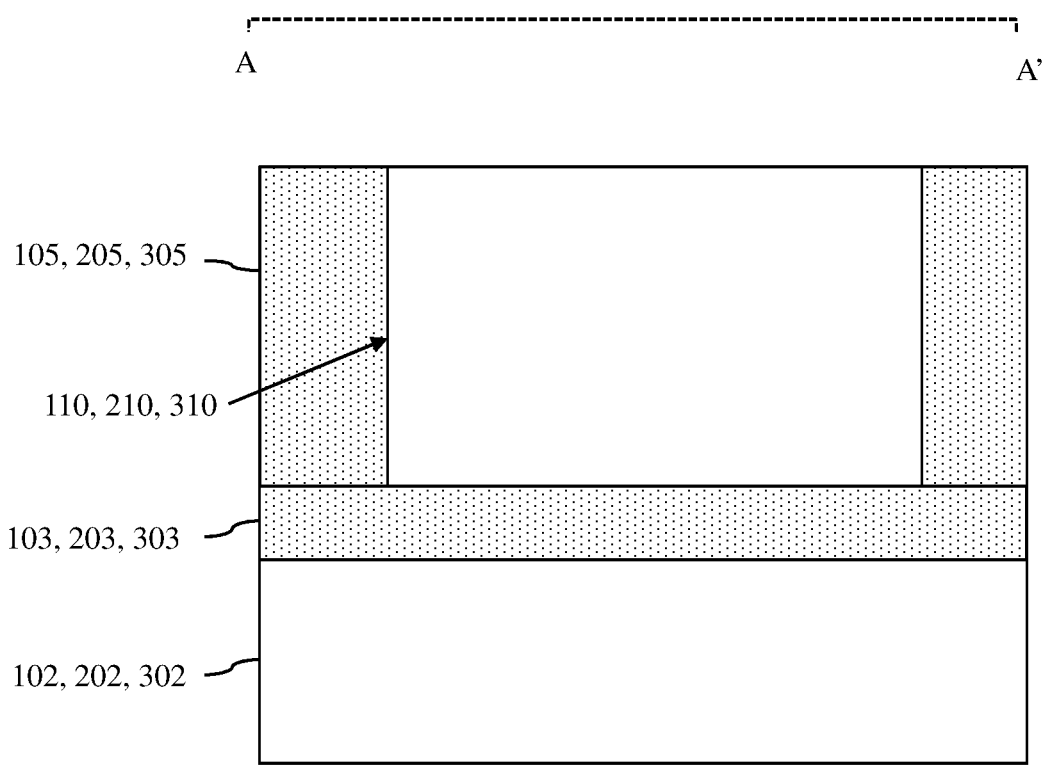
FIG. 13C is a different cross-section diagram further illustrating the same partially completed non-planar monolithic hybrid optoelectronic structure as shown in FIG. 13A.

The dielectric layer 105, 205, 305 can subsequently be planarized (e.g., using conventional chemical mechanical planarization techniques) to expose the top surface(s) of the semiconductor fin(s) 110, 210, 310 such that a remaining portion of the dielectric layer 105, 205, 305 laterally surrounds the semiconductor fin(s) 110, 201, 310 (906, see FIGS. 13A-13C).

Next, the center portion(s) of the semiconductor fin(s) are masked (908) and trenches 121-122, 221-222, 321-322 can be formed in the end portions 111-112, 211-212, 311-312 of each semiconductor fin 110, 210, 310 (910). These trenches 121-122, 221-222, 321-322 can define the optical waveguide core 150, 250, 350 in the center portion 113, 213, 313 of each semiconductor fin 110, 210, 310. As discussed in greater detail below, the non-planar monolithic hybrid optoelectronic structures formed according to the methods disclosed herein vary with respect to the depths of these trenches.

In any case, once the trenches 121-122, 221-222, 321-322 are formed in the end portions 111-112, 211-212, 311-312 of each semiconductor fin 110, 210, 310 at process 910, photonic devices 161-162, 261-262, 361-362 can be formed in the trenches 121-122, 221-222, 321-322 of each semiconductor fin 110, 210, 310 (912, see optoelectronic structure 100 of FIG. 2; optoelectronic structure 200A of FIG. 3; optoelectronic structure 200B of FIG. 4; optoelectronic structure 200C of FIG. 5; and optoelectronic structure 300 of FIG. 6). Specifically, photonic devices can be formed by epitaxially growing at least one additional semiconductor material, which is different from the semiconductor material of the optical waveguide core 150, 250, 350, within the trenches 121-122, 221-222, 321-322. That is, epitaxial layer(s) of at least one additional semiconductor material 171, 271, 371 can be grown in the first trench 121, 221, 321 of each semiconductor fin to form a light source 161, 261, 361 and epitaxial layer(s) of at least one additional semiconductor material 172, 272, 372 can be grown in the second trench 122, 222, 322 of each semiconductor fin to form a photodetector 162, 262, 362. It should be noted that the additional semiconductor material(s) 171, 271, 371 of the light source 161, 261, 361 can be the same as the additional semiconductor material(s) 172, 272 372 of the photodetector 162, 262, 362. Alternatively, the additional semiconductor material(s) 171, 272, 371 of the light source 161, 261, 361 can be different from the additional semiconductor material (s) 172, 272, 372 of the photodetector 162, 262, 362. That is, the photonic devices may be formed using the same epitaxial deposition processes such that the additional semiconductor material(s) of each of the photonic devices (i.e., of the light source and the photodetector) are the same ($912(a)$). Alternatively, the photonic device may be formed using discrete epitaxial deposition processes such that the additional semiconductor material(s) of each of the photonic devices (i.e., of the light source and the photodetector) are different ($912(b)$).

In any case, the additional semiconductor material(s) of the light source 161, 261, 361 and the photodetector 162, 262, 362 can be different from the semiconductor material of the semiconductor layer 104, 204, 304 and fins made therefrom and, thus, can be different from the optical waveguide core 150, 250, 350. Specifically, the semiconductor material of the semiconductor layer 104, 204, 304 used to form the optical waveguide core 150, 250, 350 can be transparent to specific wavelength bands, whereas the additional semiconductor material(s) used to form the light source 161, 261, 361 and the photodetector 162, 262, 362 can be semiconductor material(s) that absorb light in those specific wavelength bands. Thus, for example, if the semiconductor material used to form the optical waveguide core 150, 250, 350 is silicon, which is transparent to optical signals in the infrared wavelength bands, the additional semiconductor material(s) used to form the light source 161, 261, 361 and the photodetector 162, 262, 362 can be germanium, silicon germanium and/or III-V compound semiconductor materials, which absorb optical signals in the infrared wavelength bands. As mentioned above, the additional semiconductor material(s) of the photonic devices (i.e., of the light source and the photodetector) may be the same or different. Thus, for example, the photonic devices may both be made of germanium or silicon germanium; the photonic devices may both be made of the same III-V compound semiconductor materials; one photonic device may be made of germanium or silicon germanium and the other may be made of III-V compound semiconductor material(s); the photonic devices may be made of different III-V compound semiconductor materials; etc.

Various different light source and photodetector configurations are well known in the art and can be formed by epitaxial deposition of one or more layers of semiconductor materials, which are either in situ doped or subsequently implanted, to form the desired photonic device structure. Exemplary light sources can include, but are not limited to, light emitting diodes, laser diodes and optical modulators and exemplary photodetectors can include, but are not limited to, photodiodes (e.g., see FIGS. 7A-7F and 8A-8F and the detailed discussion above with regard to the disclosed structures). It should be understood that, depending upon the desired configurations for the light source and photodetector, the first end portion 111, 211, 311 of each semiconductor fin 110, 210, 310 would be masked during epitaxial deposition of additional semiconductor material(s) 172, 272, 372 into the second trench 122, 222, 322 and/or during subsequent doping of those additional semiconductor material(s) and similarly the second end portion 112, 211, 312 of each semiconductor fin 110, 210, 310 would be masked during epitaxial deposition of additional semiconductor material(s) 171, 271, 371 into the first trench 121, 221, 321 and/or during subsequent doping of those additional semiconductor material(s).

Optionally, the additional semiconductor material(s) 171-172, 271-272, 371-372 grown in the trenches 121-122, 221-222, 321-322 for the photonic devices 161-162, 261-262, 361-362 can be overgrown at process 912 so as to extend vertically above the level of the tops of the trenches.

After the photonic devices 161-162, 261-262, 361-362 are formed within the trenches 121-122, 221-222, 321-322 of each semiconductor fin 110, 210, 310 at process 912, additional processing can be performed in order to complete the optoelectronic structures (914, see optoelectronic structure 100 of FIG. 2, optoelectronic structure 200A of FIG. 3, optoelectronic structure 200B of FIG. 4, optoelectronic structure 200C of FIG. 5 and optoelectronic structure 300 of FIG. 6). This additional processing 914 can include formation of a cap layer 190, 290, 390 that covers the top surface of the center portion 113, 213, 313 of each semiconductor fin 110, 210, 310 between the photonic devices 161-162, 261-262 and 361-362. For example, when the additional semiconductor material(s) are overgrown at process 912 so as to extend vertically above the level of the tops of the trenches, the cap layer 190, 290, 390 can be formed by performing an oxidation process that oxidizes the top surfaces of the additional semiconductor material(s) 171-172, 271-272, 371-372 and the top surface of the center portion 113, 213, 313 of each semiconductor fin 110, 210, 310. Then, a chemical mechanical polishing process can be performed in order to expose the photonic devices 161-162, 261-262, 361-362, but not the top surface of the center portion 113, 213, 313 of each semiconductor fin 110, 210, 310. Alternatively, the cap layer can be deposited and lithographically patterned to expose the photonic devices. The additional processing 914 can also include the formation of metal contacts to the terminals of each of the photonic devices 161-162, 262-262, 361-362. Specifically, both the top epitaxial layer and the bottom epitaxial layer of each of photonic device in each trench must be separately contacted. The arrangement of these contacts can vary depending upon the configuration of the photonic devices. For example, for a photonic device that is not electrically isolated from the semiconductor substrate, a first contact can land on the top surface of the photonic device and a second contact can extend through the shallow trench isolation region to the semiconductor substrate. For a photonic device that is electrically isolated from the substrate a first contact can land on the top surface of the photonic device and a second contact, which has sidewalls lined with isolation material can extend vertically through the photonic device to the bottom epitaxial layer. Techniques for forming contacts, including contacts to buried regions within a semiconductor structure, are well known in the art and, thus, the details of such techniques have been omitted in order to allow the reader to focus on the salient aspects of the disclosed embodiments.

As mentioned above, the non-planar monolithic hybrid optoelectronic structures formed according to the methods disclosed herein vary with respect to the depths of the trenches formed at process 910.

It should be noted that epitaxial deposition of the additional semiconductor material(s) 171-172, 271-272, 371-372 for the photonic devices 161-162, 261-262, 361-362 requires a seed layer at the bottoms of the trenches 121-122, 221-222, 321-322 and, particularly, a semiconductor surface at the bottoms of the trenches 121-122, 221-222, 321-322. The trenches 121-122, 221-222, 321-322 can, thus, be etched at process 910 so that this semiconductor surface is in the semiconductor fin itself (e.g., during formation of the optoelectronic structure 100 of FIG. 2), in the semiconductor substrate (e.g., during formation of the optoelectronic structures 200A of FIG. 3, 200B of FIG. 4, or 200C of FIG. 5) or in a combination of both (e.g., in the semiconductor fin for one trench 321 and in the semiconductor substrate for the other trench 322, during formation of the optoelectronic structure 300 of FIG. 6).

Figure 14:
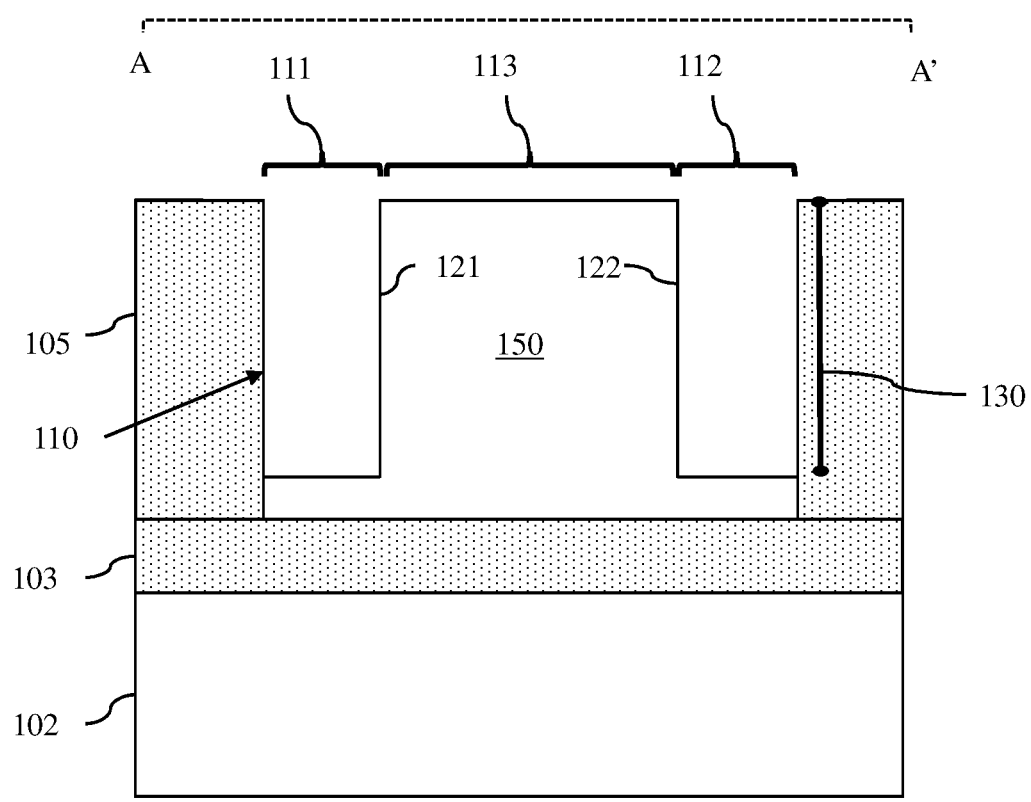
FIG. 14 is a cross-section diagram illustrating a partially completed non-planar monolithic hybrid optoelectronic structure corresponding to the completed structure shown in FIG. 2.
Figure 15:
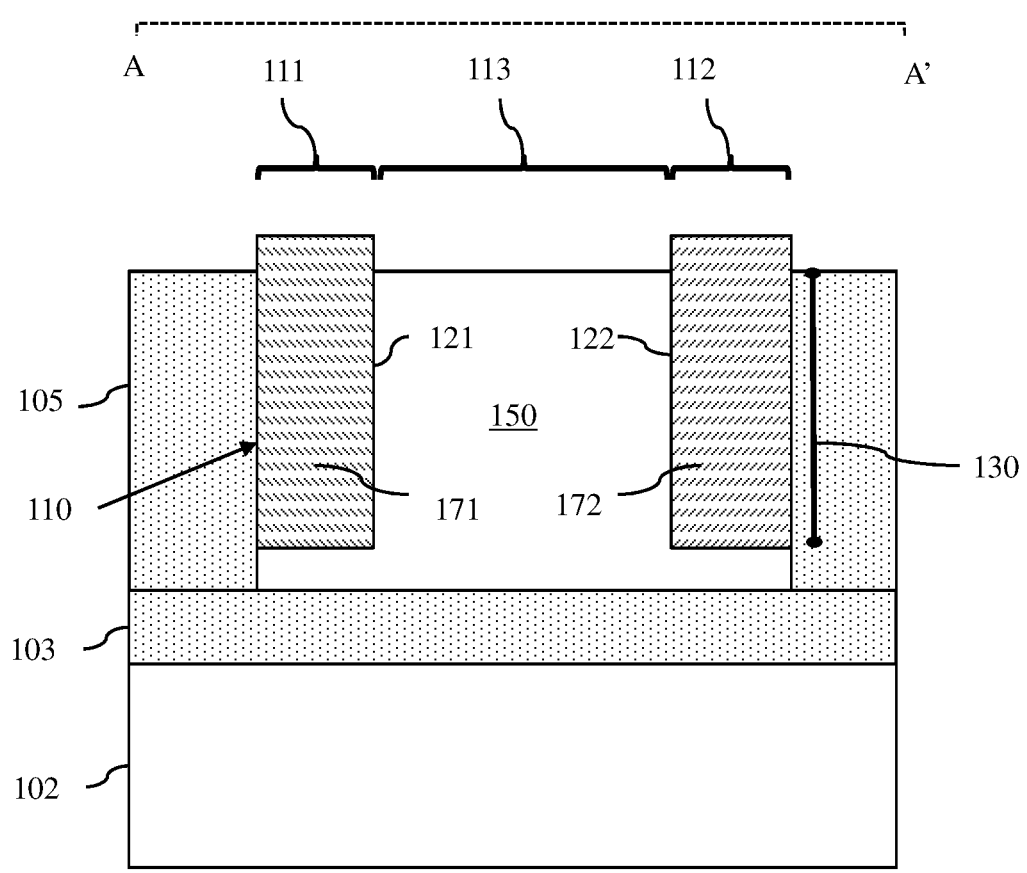
FIG. 15 is a cross-section diagram illustrating a partially completed non-planar monolithic hybrid optoelectronic structure corresponding to the completed structure shown in FIG. 2.

More specifically, in order to form the optoelectronic structure 100 of FIG. 2, in one embodiment of the method, the trenches 121-122 are etched at process 910 such that they have the same depth 130. Specifically, a mask can be formed over the center portion 113 of each semiconductor fin 110 and trenches 121-122 can be etched such that they extend vertically into the end portions 111-112, respectively, of the semiconductor fin(s) 110 and further such that the bottoms of the trenches 121-122 are above and physically separated from the top surface of the insulator layer 103, as shown in FIG. 14. In this case, the photonic devices 161-162 can be formed at process 912 by epitaxial deposition of the additional semiconductor material(s) 171-172 within the trenches 121-122 above and immediately adjacent to remaining portions of the semiconductor fin(s) 110 below the trenches 121-122, as shown in the partially completed structure of FIG. 15 and in the optoelectronic structure 100 of FIG. 2.

Figure 16:
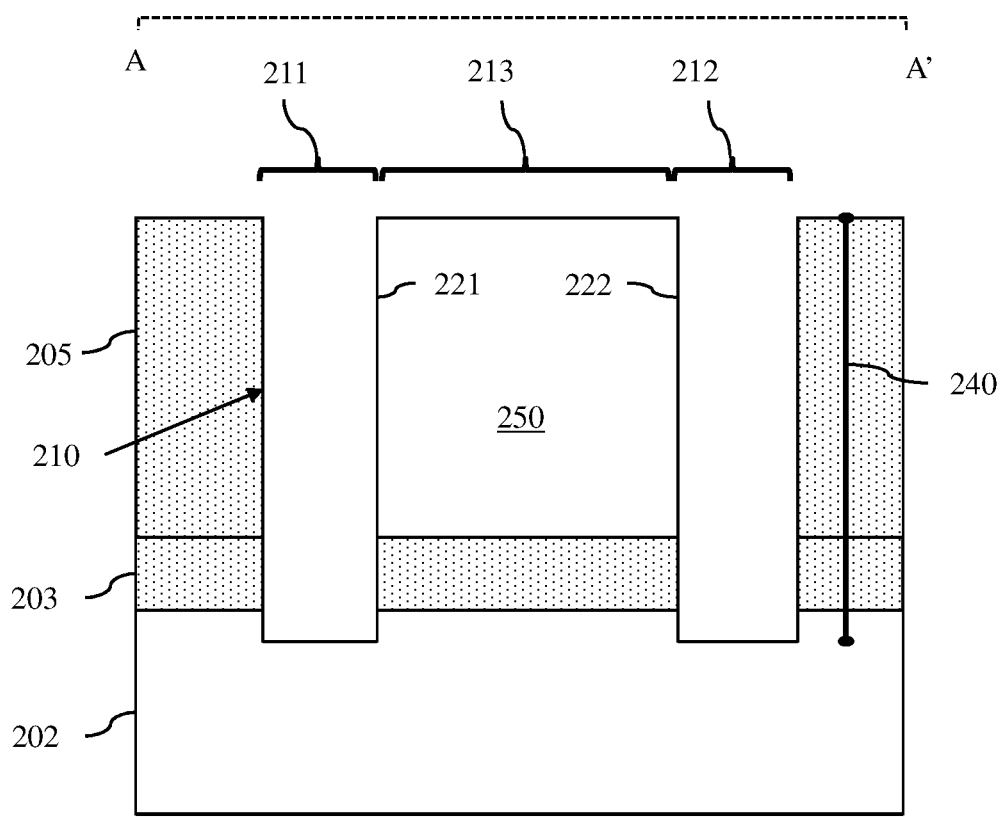
FIG. 16 is a cross-section diagram illustrating a partially completed non-planar monolithic hybrid optoelectronic structure corresponding to the completed structures shown in FIGS. 3-5.

In order to form the optoelectronic structures 200A of FIG. 3, 200B of FIG. 4, or 200C of FIG. 5, in another embodiment of the method, the trenches 221-222 can be etched at process 910 so as to have the same depth 240, which is significantly deeper than the depth 130 discussed above. Specifically, a mask can be formed over the center portion 213 of each semiconductor fin 210 and trenches 221-222 can be etched such that they extend vertically completely through the end portions 211-212 of the semiconductor fin(s) 210 and also through the insulator layer 203 to the semiconductor substrate 202 below and such that the bottoms of the trenches 221-222 are at or below the top surface of the semiconductor substrate 202, as shown in FIG. 16. In this case, the photonic devices 261-262 can be formed at process 912 by epitaxial deposition of the additional semiconductor material(s) 271-272 within the trenches 221-222 such that the photonic devices 261-262 effectively form replacement end portions, which replace original end portions of the semiconductor fin(s) 210 that were completely etched away during trench formation, as shown the partially completed structure of FIG. 17.

Figure 17:
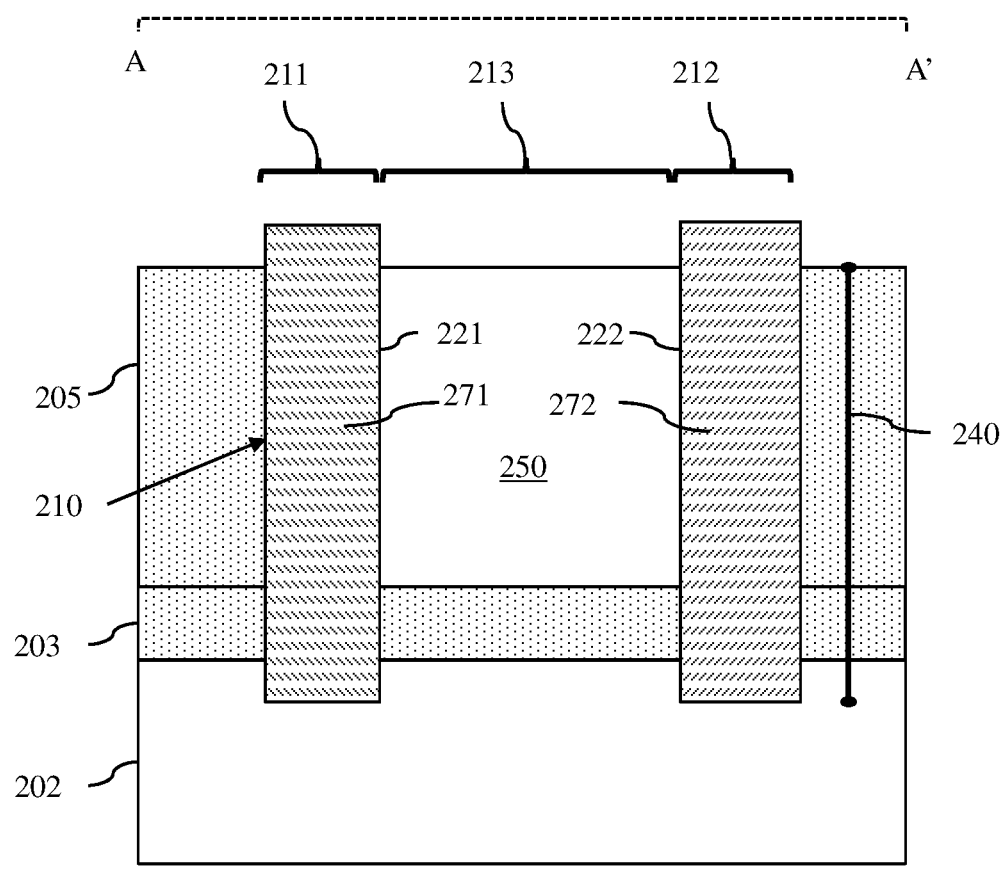
FIG. 17 is a cross-section diagram illustrating a partially completed non-planar monolithic hybrid optoelectronic structure corresponding to the completed structure shown in FIG. 3.
Figure 18:
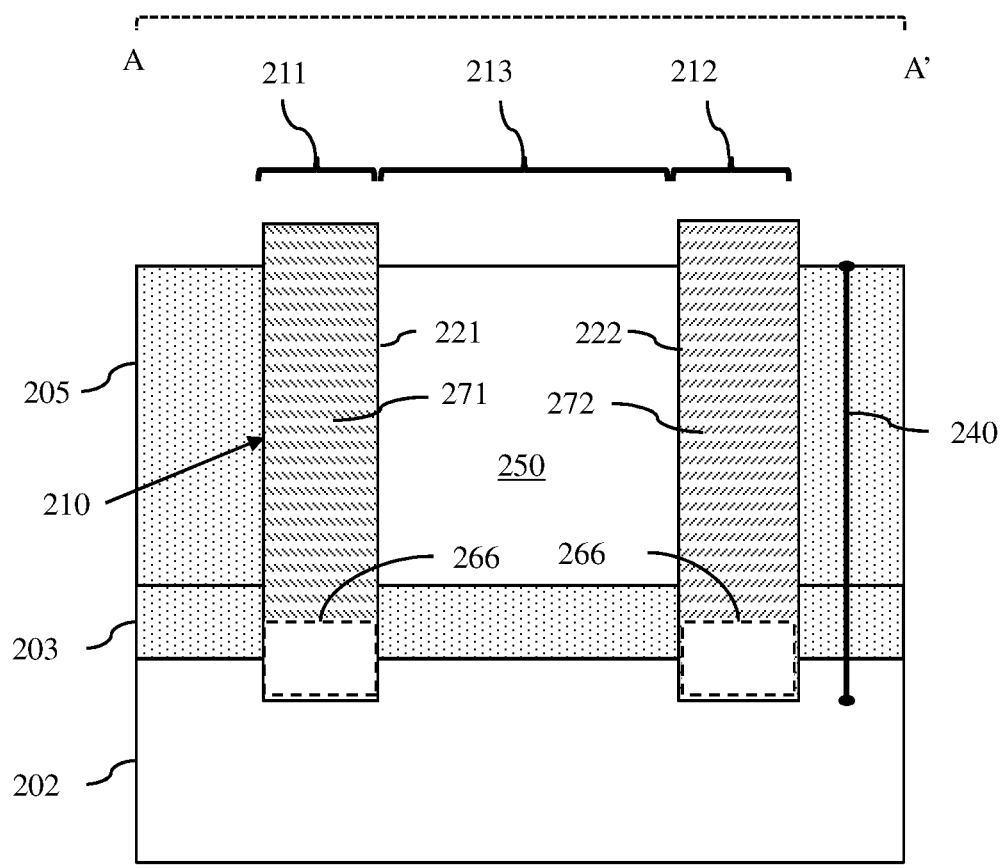
FIG. 18 is a cross-section diagram illustrating a partially completed non-planar monolithic hybrid optoelectronic structure corresponding to the completed structure shown in FIG. 3.
Figure 19:
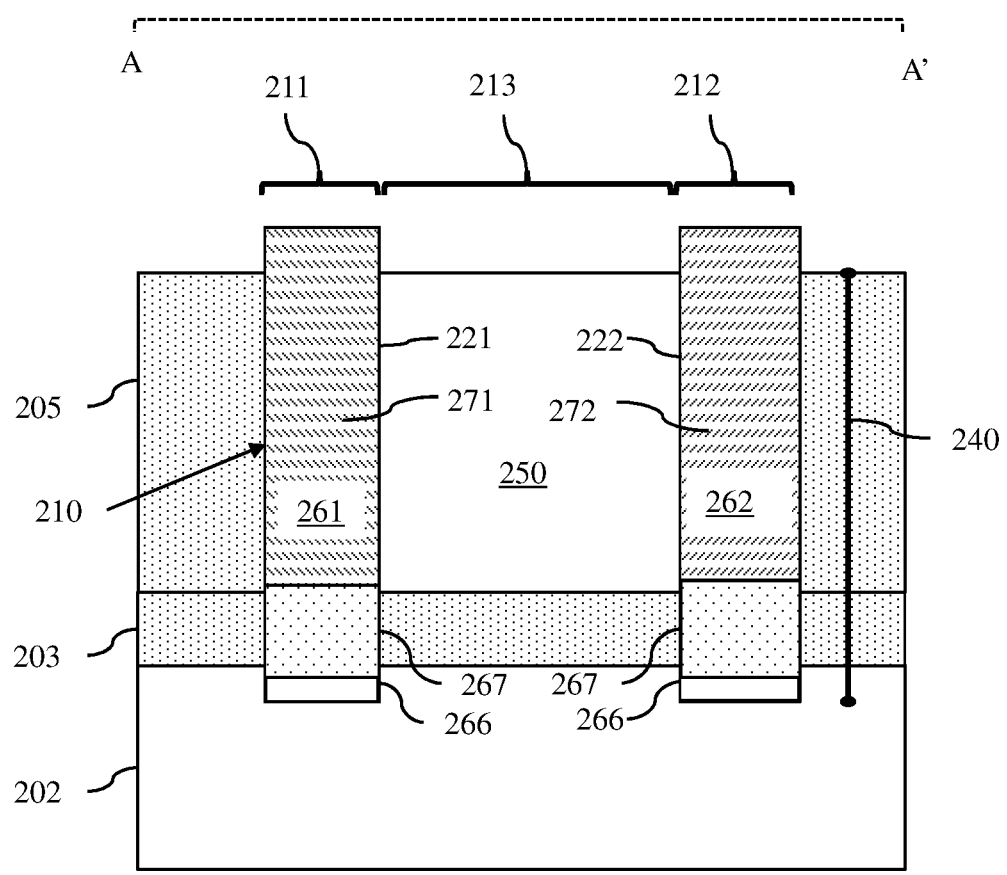
FIG. 19 is a cross-section diagram illustrating a partially completed non-planar monolithic hybrid optoelectronic structure corresponding to the completed structure shown in FIG. 4.
Figure 20:
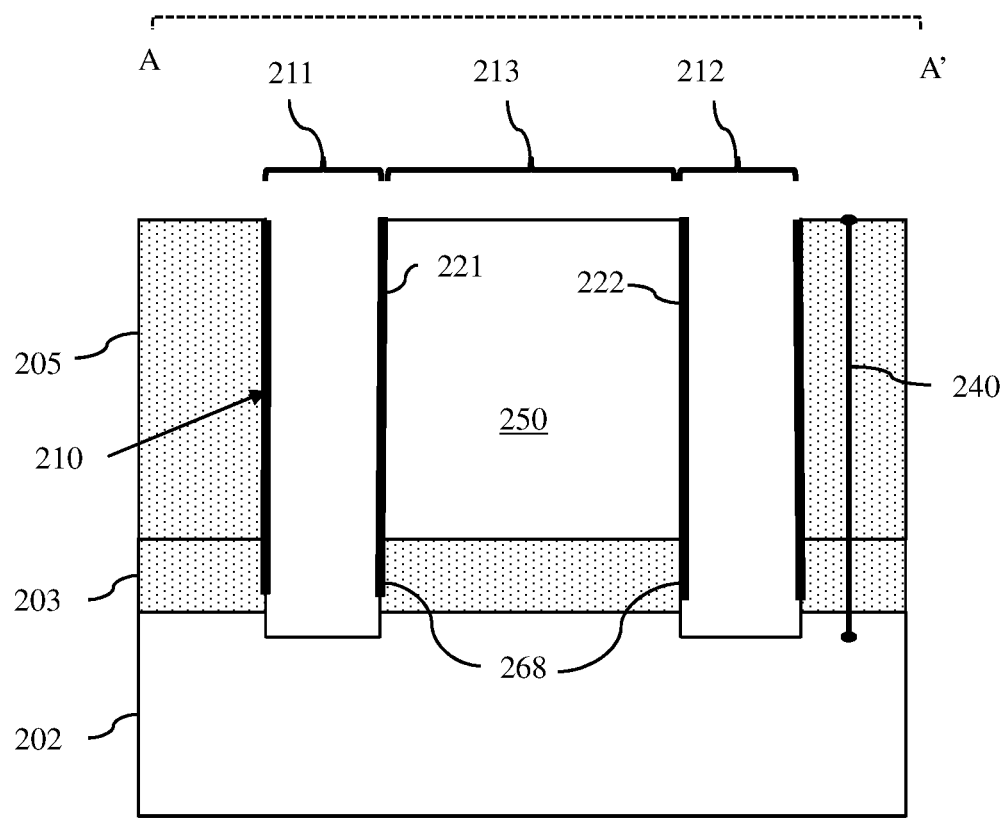
FIG. 20 is a cross-section diagram illustrating a partially completed non-planar monolithic hybrid optoelectronic structure corresponding to the completed structure shown in FIG. 5.
Figure 21:
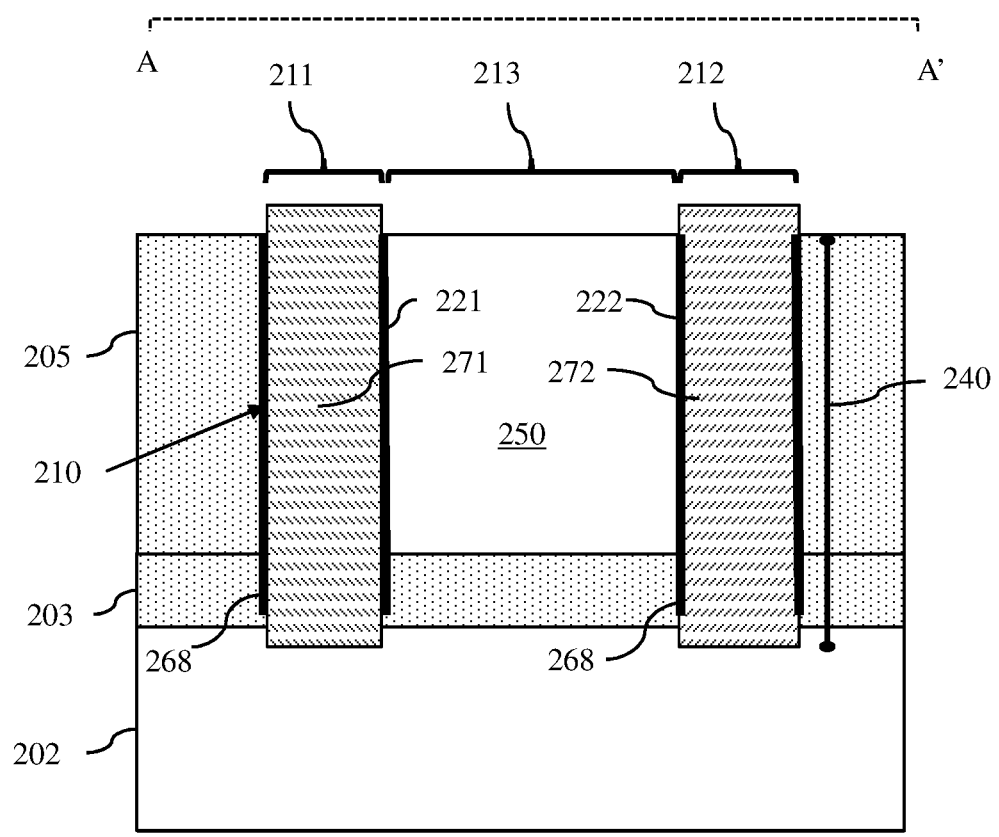
FIG. 21 is a cross-section diagram illustrating a partially completed non-planar monolithic hybrid optoelectronic structure corresponding to the completed structure shown in FIG. 5.
Figure 22:
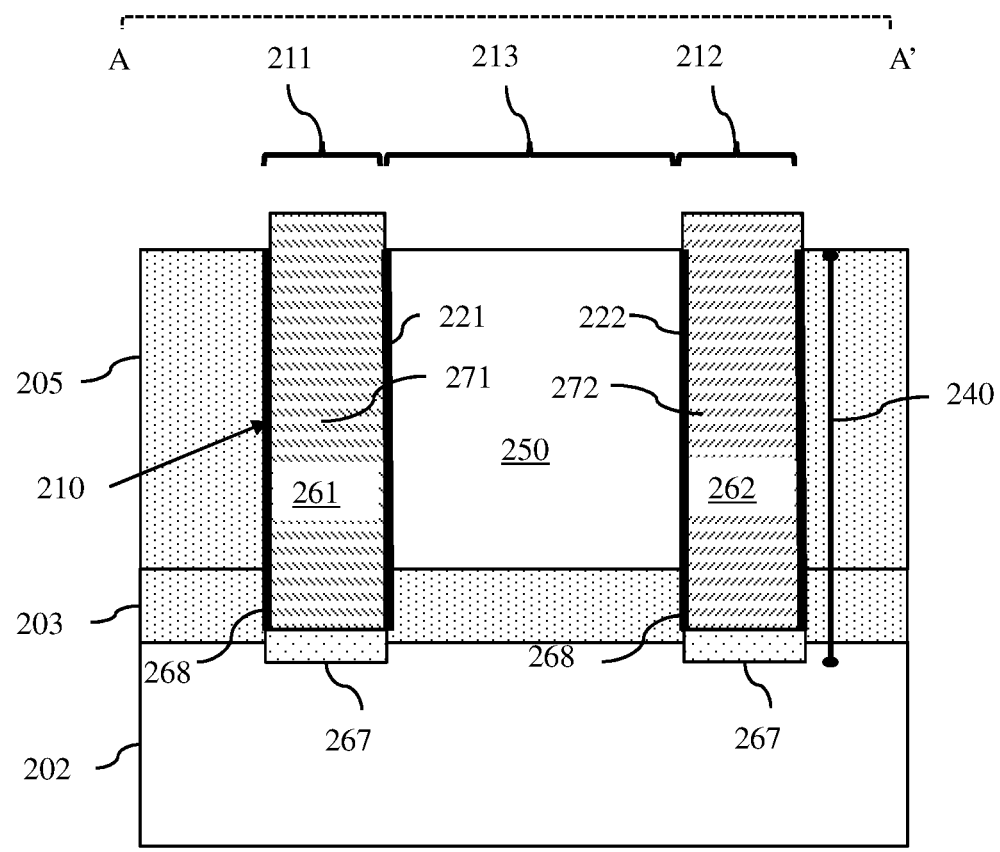
FIG. 22 is a cross-section diagram illustrating a partially completed non-planar monolithic hybrid optoelectronic structure corresponding to the completed structure shown in FIG. 5.

Optionally, before the additional semiconductor materials(s) 271-272 are epitaxially deposited into the trenches 221-222, an epitaxial layer of silicon may be grown on the exposed surface of the semiconductor substrate 202 (thereby forming silicon regions 266 within the trenches 221-222) and the additional semiconductor material(s) 271-272 can be grown on the silicon regions 266, as shown in the partially completed structure of FIG. 18 and in the optoelectronic structure 200A of FIG. 3. It should be noted that, during processing, when the additional semiconductor material(s) 271-272 are epitaxially grown in the trenches 221-222 on a semiconductor surface, which is a different semiconductor material and which functions as a seed layer (e.g., on the semiconductor substrate 202, as shown in FIG. 17, or on optional epitaxial silicon regions 266, as shown in FIG. 18), defects may form adjacent to the interface between the different semiconductor materials (e.g., at the silicon to germanium, silicon germanium or III-V compound semiconductor material interface). Since that interface is exposed to the oxide material of the insulator layer 203, subsequent anneal processes may result in the formation of oxide regions 267 in the trenches 221-222 between the semiconductor substrate 203 and the photonic devices 261-262, as shown in the partially completed structure of FIG. 19 and in the optoelectronic structure 200B of FIG. 4. Optionally, before any semiconductor materials are epitaxial deposited into the trenches 221-222, the sidewalls of the trenches 221-222 may be lined with a protective layer 268 (e.g., a silicon nitride (SiN) layer or other suitable non-oxide protective layer), as shown in the partially completed structure of FIG. 20. Once the protective layer 268 is formed on the sidewalls of the trenches 221-222, the optional epitaxial layer of silicon (not shown) and the epitaxial layer(s) of the additional semiconductor material(s) can be deposited, as shown in the partially completed structure of FIG. 21. This protective layer 268 limits exposure of the interface to the oxide material of the insulator layer 203 and, thus, limits the thickness of the resulting oxide regions 267 within the trenches 221-222 below the photonic devices 261-262 following an anneal, as shown in the partially completed structure of FIG. 22 and in the non-planar monolithic hybrid optoelectronic structure 200C of FIG. 5.

Figure 23:
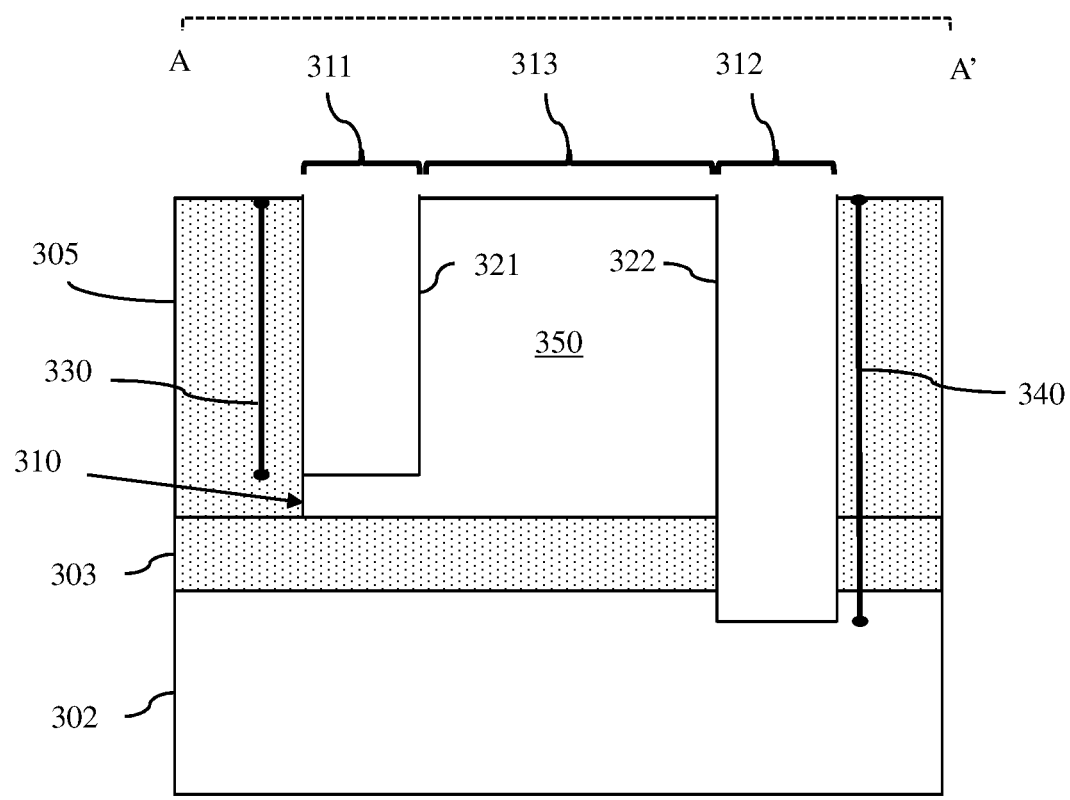
FIG. 23 is a cross-section diagram illustrating a partially completed non-planar monolithic hybrid optoelectronic structure corresponding to the completed structure shown in FIG. 6; and, FIG. 24 is a cross-section diagram illustrating a partially completed non-planar monolithic hybrid optoelectronic structure corresponding to the completed structure shown in FIG. 6.
Figure 24:
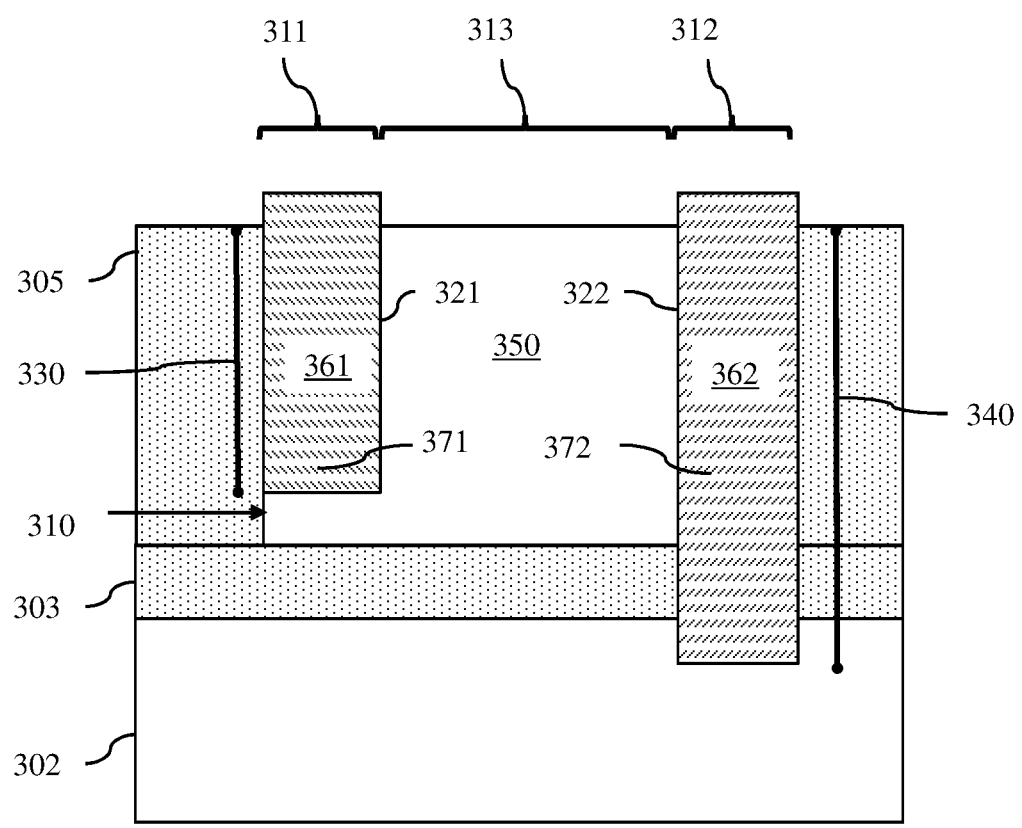

In order to form the non-planar monolithic hybrid optoelectronic structure 300 of FIG. 6, in yet another embodiment of the method multiple masked etch processes can be performed at process 910 to form trenches 321-322 that have different depths. Specifically, a first trench 321 can be etched such that it extends vertically into a first end portion 311 of each semiconductor fin 310 to a first depth 330 such that the bottom of that first trench 321 is above and physically separated from the top surface of the insulator layer 303, as shown in the partially completed structure of FIG. 23. Additionally, a second trench 322 can be etched such that it extends vertically completely through a second end portion 312 of each semiconductor fin 310 and through the insulator layer 303 to a second depth 340 such that the bottom of the second trench 322 is at or below the top surface of the semiconductor substrate, also as shown in the partially completed structure of FIG. 23. In this case, the photonic device 361 can be formed by epitaxial deposition at process 912 such that it is contained within the first trench 321 above and immediately adjacent to remaining portion of the semiconductor fin(s) 310 below the trench 321 similar to the photonic device 161 of FIG. 2, whereas the photonic device 362 can be formed at process 912 by epitaxial deposition at process 912 such that it is contained within the second trench 321 and such that it has features similar to the photonic device 262 of FIGS. 3-5, as shown in the partially completed structure of FIG. 23 and in the optoelectronic structure of FIG. 6.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An optoelectronic structure comprising:
    an insulator layer;
    at least one semiconductor fin having a bottom surface immediately adjacent to the insulator layer, a top surface opposite the bottom surface, a first sidewall, a second sidewall opposite the first sidewall, a first end and a second end opposite the first end, wherein a distance between the first sidewall and the second sidewall is less than a height of the semiconductor fin from the bottom surface to the top surface and further less than a width of the semiconductor fin from the first end to the second end; and,
    a dielectric layer above and immediately adjacent to the insulator layer and further laterally surrounding the semiconductor fin such that the dielectric layer is immediately adjacent to the first sidewall, the second sidewall, the first end and the second end,
        the semiconductor fin having end portions and a center portion positioned laterally between the end portions,
        the center portion comprising a semiconductor material and being an optical waveguide core,
        the end portions having trenches and comprising photonic devices in the trenches, and
        each photonic device comprising at least one additional semiconductor material that is different from the semiconductor material of the center portion.

2. The optoelectronic structure of claim 1, the semiconductor material of the center portion comprising silicon and, in each photonic device, the at least one additional semiconductor material comprising at least one of germanium, silicon germanium and an III-V compound semiconductor material.

3. The optoelectronic structure of claim 1, the photonic devices comprising a light source and a photodetector and the at least one additional semiconductor material of the light source being different from the at least one additional semiconductor material of the photodetector.

4. The optoelectronic structure of claim 1, the photonic devices comprising a light source and a photodetector and the at least one additional semiconductor material of the light source and the at least one additional semiconductor material of the photodetector being a same semiconductor material.

5. The optoelectronic structure of claim 1, the trenches having either different depths or a same depth.

6. The optoelectronic structure of claim 1, further comprising a semiconductor substrate below the insulator layer, wherein bottoms of the trenches are above and physically separated from the insulator layer.

7. The optoelectronic structure of claim 1, further comprising a cap layer above and immediately adjacent to the top surface of the semiconductor fin at the center portion, the cap layer further extending laterally between and being immediately adjacent to the photonic devices, wherein top surfaces of the cap layer, the photonic devices and the dielectric layer are essentially co-planar.

8. An optoelectronic structure comprising:
    a semiconductor substrate;
    an insulator layer above the semiconductor substrate;
    at least one semiconductor fin above the insulator layer; and,
    a dielectric layer laterally surrounding the semiconductor fin,
        the semiconductor fin having replacement end portions and a center portion positioned laterally between the replacement end portions,
        the center portion comprising a semiconductor material and being an optical waveguide core, and
        the replacement end portions comprising photonic devices in trenches,
        the trenches extending vertically through the semiconductor fin and the insulator layer to the semiconductor substrate on opposing sides of the center portion, and
        each photonic device comprising at least one additional semiconductor material that is different from the semiconductor material of the center portion.

9. The optoelectronic structure of claim 8, the semiconductor material of the at least one semiconductor fin comprising silicon and, in each photonic device, the at least one additional semiconductor material comprising at least one of germanium, silicon germanium and an III-V compound semiconductor material.

10. The optoelectronic structure of claim 8, the photonic devices comprising a light source and a photodetector and the at least one additional semiconductor material of the light source being different from the at least one additional semiconductor material of the photodetector.

11. The optoelectronic structure of claim 8, the photonic devices comprising a light source and a photodetector and the at least one additional semiconductor material of the light source and the at least one additional semiconductor material of the photodetector comprising a same semiconductor material.

12. The optoelectronic structure of claim 8, further comprising at least one of epitaxial silicon regions and oxide region in the trenches between the semiconductor substrate and the photonic devices.

13. The optoelectronic structure of claim 8, further comprising a protective layer lining sidewalls of the trenches.

14. An optoelectronic structure comprising:
   an insulator layer;
   at least one semiconductor fin having a bottom surface immediately adjacent to the insulator layer, a top surface opposite the bottom surface, a first sidewall, a second sidewall opposite the first sidewall, a first end and a second end opposite the first end, wherein a distance between the first sidewall and the second sidewall is less than a height of the semiconductor fin from the bottom surface to the top surface and further less than a width of the semiconductor fin from the first end to the second end;
   a dielectric layer above and immediately adjacent to the insulator layer and further laterally surrounding the semiconductor fin such that the dielectric layer is immediately adjacent to the first sidewall, the second sidewall, the first end and the second end,
      the semiconductor fin having end portions and a center portion positioned laterally between the end portions,
      the center portion comprising a semiconductor material and being an optical waveguide core,
      the end portions having trenches and comprising photonic devices in the trenches, and
         each photonic device comprising at least one additional semiconductor material that is different from the semiconductor material of the center portion; and
   a cap layer above and immediately adjacent to the top surface of the semiconductor fin at the center portion, the cap layer further extending laterally between and being immediately adjacent to the photonic devices, wherein top surfaces of the cap layer, the photonic devices and the dielectric layer are essentially co-planar.

15. The optoelectronic structure of claim 14, the semiconductor material of the center portion comprising silicon and, in each photonic device, the at least one additional semiconductor material comprising at least one of germanium, silicon germanium and an III-V compound semiconductor material.

16. The optoelectronic structure of claim 14, the photonic devices comprising a light source and a photodetector and the at least one additional semiconductor material of the light source being different from the at least one additional semiconductor material of the photodetector.

17. The optoelectronic structure of claim 14, the photonic devices comprising a light source and a photodetector and the at least one additional semiconductor material of the light source and the at least one additional semiconductor material of the photodetector being a same semiconductor material.

18. The optoelectronic structure of claim 14, the trenches having either different depths or a same depth.

19. The optoelectronic structure of claim 14, further comprising a semiconductor substrate below the insulator layer, wherein bottoms of the trenches are above and physically separated from the insulator layer.

\* \* \* \* \*